(12) United States Patent
Roux et al.

(10) Patent No.: US 7,633,599 B2
(45) Date of Patent: Dec. 15, 2009

(54) APPARATUSES AND METHODS FOR CHANGING AN INTENSITY DISTRIBUTION OF LIGHT WITHIN AN ILLUMINATION FIELD WITHOUT DISTORTING THE TELECENTRICITY OF THE LIGHT

(75) Inventors: Stephen Roux, New Fairfield, CT (US); Erik Loopstra, Ba Heeze (NL); Michael L. Nelson, West Redding, CT (US)

(73) Assignee: ASML Holding N.V., Veldhoven (NL)

( * ) Notice: Subject to any disclaimer, the term of this patent is extended or adjusted under 35 U.S.C. 154(b) by 548 days.

(21) Appl. No.: 11/523,695

(22) Filed: Sep. 20, 2006

(65) Prior Publication Data

US 2007/0013891 A1   Jan. 18, 2007

Related U.S. Application Data

(63) Continuation of application No. 10/962,550, filed on Oct. 13, 2004, now Pat. No. 7,119,883.

(51) Int. Cl.
*G03B 27/72* (2006.01)
*G03B 27/42* (2006.01)

(52) U.S. Cl. .......................................... 355/69; 355/53
(58) Field of Classification Search .................. 355/53, 355/67–71; 250/548; 356/399–401; 396/452
See application file for complete search history.

(56) References Cited

U.S. PATENT DOCUMENTS

| 4,571,045 A | 2/1986 | Uematsu |
| 5,315,629 A | 5/1994 | Jewell et al. |
| 5,361,292 A | 11/1994 | Sweatt |

(Continued)

FOREIGN PATENT DOCUMENTS

JP    10-106942 A    4/1998

(Continued)

OTHER PUBLICATIONS

Office Action and Translation of Office Action for Japanese Patent Application No. 2005-299354 mailed Sep. 24, 2008, 7 pgs.

(Continued)

*Primary Examiner*—Hung Henry Nguyen
(74) *Attorney, Agent, or Firm*—Sterne, Kessler, Goldstein & Fox P.L.L.C.

(57) ABSTRACT

An apparatus for changing an intensity distribution of a light within an illumination field includes a structure configured to be positioned within the illumination field so that a first portion of the light within the illumination field impinges upon the structure, where the structure is translucent or opaque to a wavelength of the light. The apparatus also includes an actuator configured to cause a movement of a first portion of the structure so that a second portion of the light within the illumination field impinges upon the structure. The light within the illumination field is produced by a source configured so that a pupil fill of a beam of the light is uncontrolled, but the beam of the light downstream of the structure is substantially telecentric before and after the movement of the first portion of the structure. Related methods are also presented.

20 Claims, 18 Drawing Sheets

U.S. PATENT DOCUMENTS

| | | | |
|---|---|---|---|
| 5,631,721 | A | 5/1997 | Stanton et al. |
| 6,014,252 | A | 1/2000 | Shafer |
| 6,097,474 | A | 8/2000 | McCullough et al. |
| 6,186,632 | B1 | 2/2001 | Chapman et al. |
| 6,195,201 | B1 | 2/2001 | Koch et al. |
| 6,295,119 | B1 | 9/2001 | Suzuki |
| 6,307,682 | B1 | 10/2001 | Hoffman et al. |
| 6,476,905 | B1 * | 11/2002 | Li ............................... 355/71 |
| 6,522,387 | B2 | 2/2003 | Mulkens |
| 6,560,044 | B2 | 5/2003 | Shinoda |
| 6,563,907 | B1 | 5/2003 | Kubiak et al. |
| 6,741,329 | B2 * | 5/2004 | Leenders et al. .............. 355/53 |
| 6,819,403 | B2 | 11/2004 | Komatsuda |
| 6,853,493 | B2 | 2/2005 | Kreitzer |
| 7,119,883 | B2 | 10/2006 | Roux et al. |
| 2004/0189967 | A1 | 9/2004 | Ottens et al. |

FOREIGN PATENT DOCUMENTS

| | | |
|---|---|---|
| JP | 2001-244183 A | 9/2001 |
| JP | 2001-250762 A | 9/2001 |
| JP | 2002-184676 A | 6/2002 |
| JP | 2003-092253 A | 3/2003 |
| JP | 2003-178969 A | 6/2003 |

OTHER PUBLICATIONS

*Aberrations*, 1 page, printed from http://www.mellesgriot.com/glossary/wordlist/-glossarydetails.asp?wID=78, (printed Jul. 3, 2003).

Bjorkholm, J.E., "EUV Lithography—The Successor to Optical Lithography?" *Intel Technology Journal Q3'98*, pp. 1-8, (1998).

Braat, J., "Design of an optical system towards an isoplanatic prescription," pp. 1-12, (undated).

Braat, J., "Extreme UV lithography, a candidate for next-generation lithography," pp. 1-10, (Oct. 18, 2000).

*DoITPoMS Teaching and Learning Packages: Resolution and imaging*, 5 pages, printed from http://www.msm.cam.ac.uk/doitpoms/tlplib/CD1/resolution.php, (printed Jul. 15, 2004).

*Edmund Industrial Optics: Condenser Lenses*, 2 pages, printed from http://www.edmundoptics.com/IOD/DisplayProduct.cfm?Productid=2032, (Copyright 2001).

Gwyn, C., "The timeline puts the screws to extreme ultraviolet lithography, but engineers rise to the challenge," *oe Magazine*, 6 pages, printed from http://oemagazine.com-/fromTheMagazine/jun02/euv.html, (Copyright 2000-2002).

*Lens Combinations: Aberration Balancing*, 2 pages, printed from http://www.mellesgriot.com/products/optics/fo_4_2.htm, (Copyright 2002).

Michalski, J., "What is Telecentricity?", 5 pages, printed from http://www.edmundoptics.com/techsupport/DisplayArticle.cfm?articleid=261, (Copyright 2001).

Spring, K.R. and Davidson, M.W., *Basic Concepts and Formulas in Microscopy: Depth of Field and Depth of Focus*, 4 pages, printed from http://www.microscopyu.com-/articles/formulas/forumalsfielddepth.html, (Copyright 2000-2004).

Tichenor, D.A. et al., "Initial Results from the EUV Engineering Test Stand," 10 pages, (undated).

Watanabe, Y., *Canon EUVL Plans*, Nanotechnology & Advanced System Research Laboratories, 20 pages of slides, (undated).

* cited by examiner

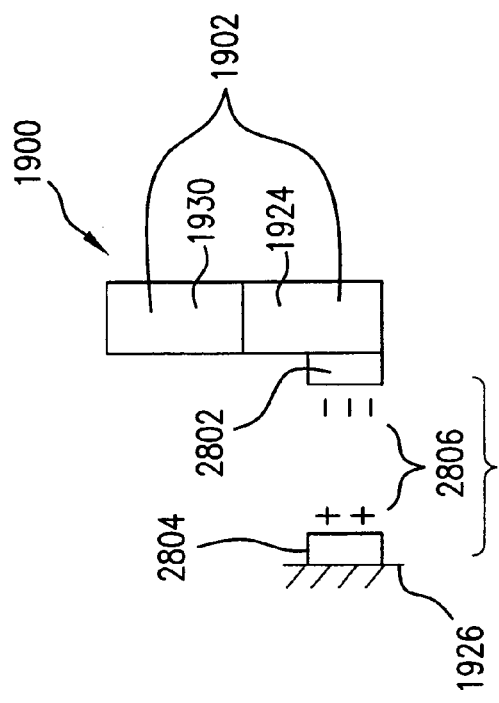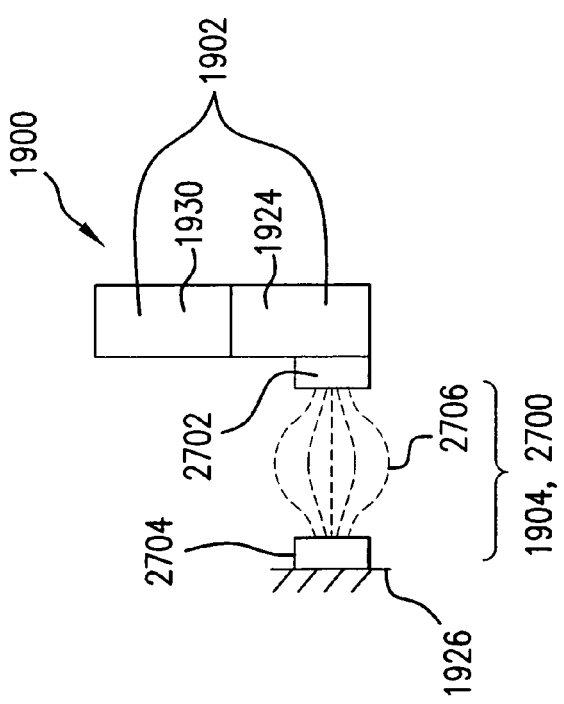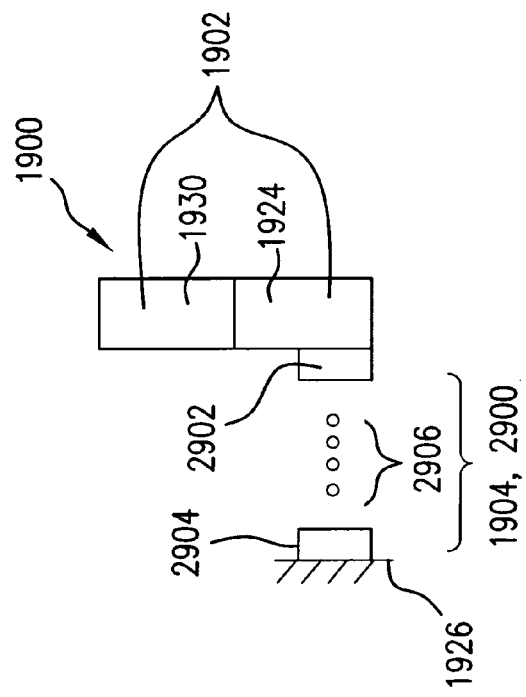
FIG.28
FIG.27
FIG.29

APPARATUSES AND METHODS FOR CHANGING AN INTENSITY DISTRIBUTION OF LIGHT WITHIN AN ILLUMINATION FIELD WITHOUT DISTORTING THE TELECENTRICITY OF THE LIGHT

CROSS-REFERENCE TO RELATED APPLICATIONS

This application is a continuation of U.S. application Ser. No. 10/962,550, filed Oct. 13, 2004, now U.S. Pat. No. 7,119,883, which is incorporated herein in its entirety by reference.

BACKGROUND OF THE INVENTION

1. Field of the Invention

The present invention relates to correcting variations in the intensity of light within an illumination field without distorting the telecentricity of the light.

2. Related Art

In an integrated circuit chip, devices and their connections are typically fabricated in phases. Several phases include processes that modify portions of a semiconductor substrate (i.e., a wafer). For each of these phases, the portions to be processed must be isolated from the remaining portions of the wafer. Typically this is accomplished by replicating a two dimensional pattern on a surface of the wafer. Photolithographic tools that effect this replication are often referred to as wafer steppers or wafer scanners.

The pattern distinguishes the portions of the wafer to be processed from the remaining portions. The pattern is formed on a mask (i.e., a reticle) having corresponding opaque and either transparent or reflective portions. A beam of light is made to impinge upon the reticle so that the pattern is transferred to the cross section of the beam perpendicular to its direction of propagation (i.e., the illumination field). (The illumination field usually is shaped as a rectangle or an annulus sector.) Optical devices positioned along the optical path between the reticle and the wafer reduce the size of the pattern and cause the beam of light to impinge upon the wafer. A layer of film (i.e., a photoresist) is applied on the surface of the wafer. When the photoresist is exposed to the beam of light, corresponding portions of the photoresist are exposed. Either the exposed or unexposed (but not both) portions of the photoresist are removed to reveal the underlying portions of the wafer to be processed. The remaining portions of the wafer are protected from the process by the remaining photoresist.

Undesirable variations in positions or feature sizes can affect the electrical and electronic characteristics of the fabricated devices. Therefore, it is important to be able to control positions and feature sizes precisely. When the wavelength of the light that impinges upon a surface of a wafer is on an order of tens to hundreds of nanometers, variations in the flatness of the wafer surface can be significantly large enough to preclude modeling the wafer surface as a single image plane. For this reason, it is important that the light that impinges upon the wafer surface be substantially telecentric.

Moreover, variations in the intensity of the light at points within the illumination field can affect the degrees to which the photoresist at these points are exposed. For this reason, it is also important to correct for variations in the intensity of the light within the illumination field. Therefore, what is needed is an apparatus and method for correcting variations in the intensity of the light within the illumination field without distorting the telecentricity of the light that impinges upon the layer of photoresist.

BRIEF SUMMARY OF THE INVENTION

The present invention relates to correcting variations in the intensity of light within an illumination field without distorting the telecentricity of the light. The present invention provides an apparatus for changing an aggregate intensity of the light within an illumination field of a photolithography system. In an embodiment, the apparatus has a blade structure and a first actuator. The blade structure is configured to be positioned along an optical path of the photolithography system between an illumination system and a reticle stage so that, when the illumination system provides the light having the illumination field, the blade structure is substantially at a center of the illumination field. Because the blade structure is substantially at the center of the illumination field, the blade structure does not distort the telecentricity of the light within the illumination field. The blade structure is either translucent or opaque to the wavelength of the light. A first portion of the light within the illumination field impinges upon the blade structure. The first portion of the light has a first area. The cumulative intensity of the light, to which points at the reticle opposite the blade structure are exposed over the course of a scan of the reticle stage, is reduced in proportion to the first area.

The first actuator is coupled between a first portion of the blade structure and a frame of the photolithography system and is configured to move or rotate at least the first portion of the blade structure in a first direction so that, when the illumination system provides the light having the illumination field, a second portion of the light within the illumination field impinges upon the blade structure. The second portion of the light has a second area. The second area can be larger or smaller than the first area, but is different from the first area. The cumulative intensity of the light, to which points at the reticle opposite the blade structure are exposed over the course of a scan of the reticle stage, is reduced in proportion to the second area.

Thus, the reduction in the cumulative intensity of the light at points at the reticle opposite the blade structure when the first actuator has moved the first portion of the blade structure in the first direction is different from when the first actuator has not moved the first portion of the blade structure. In this manner, the apparatus of the present invention can be used to correct variations in the intensity of the light within the illumination field without distorting the telecentricity of the light.

In an embodiment, the illumination field can be shaped as a rectangle. The blade structure can have a blade structure length, a blade structure width, and a blade structure height. The blade structure can be oriented so that, when the illumination system provides the light having the illumination field, the blade structure length is substantially parallel to an illumination field length, the blade structure width is substantially parallel to an illumination field width, and the blade structure width substantially intersects a line that passes through a midpoint of the illumination field width, the line being substantially parallel to the illumination field length. The blade structure width can be about ten microns.

In another embodiment, the illumination field can be shaped as an annulus sector. The blade structure can have a blade structure outer arc, a blade structure inner arc, a blade structure width, and a blade structure height. The blade structure can be oriented so that, when the illumination system provides the light having the illumination field, the blade structure outer arc is substantially similar to an illumination field outer arc, the blade structure inner arc is substantially similar to an illumination field inner arc, and the blade structure width substantially intersects an arc located midway between the illumination field outer arc and the illumination field inner arc. The blade structure width can be about ten microns.

When the illumination system provides the light having the illumination field, a movement in the first direction can decrease the aggregate intensity of the light within the illumination field. Alternatively, when the illumination system provides the light having the illumination field, a movement in the first direction can increase the aggregate intensity of the light within the illumination field.

The first portion of the blade structure can be a flap. The flap can be coupled to a second portion of the blade structure by, for example, a hinge. The flap can be one of a plurality of flaps. A first flap can be separated from a second flap by a slit. The slit can have an open end and a closed end. The closed end can have a shape, such as, for example, a keyhole, to reduce a stress at the closed end. The first actuator can be one of a plurality of actuators. For example, a first actuator of the plurality of actuators can be coupled to the first flap and configured to move it in the first direction, while a second actuator of the plurality of actuators can be coupled to the second flap and configured to move it in the first direction. Control of the first actuator of the plurality of actuators can be independent of control of the second actuator of the plurality of actuators.

The first actuator can be further configured to move the first portion of the blade structure in a second direction, which is opposite the first direction. Alternatively, the apparatus can also have a second actuator coupled to the first portion of the blade structure and configured to move at least the first portion of the blade structure in the second direction. Alternatively, the first portion of the blade structure can be configured to move in the second direction via a gravitational force. For example, the first portion of the blade structure can have a part with sufficient mass to provide the gravitational force. Alternatively, the blade structure can be made of at least an elastic material and configured to move in the second direction via an elastic restoring force. For example, the elastic material can be at least one of stainless steel, silver, nickel, aluminum, copper, and silicon.

The present invention also provides a method for changing an aggregate intensity of a light within an illumination field of a photolithography system. Light having an illumination field is provided by an illumination system of the photolithography system. A blade structure is positioned along an optical path of the photolithography system between the illumination system and the reticle stage and substantially at a center of the illumination field so that a first portion of the light within the illumination field impinges upon the blade structure. The blade structure is translucent or opaque to the wavelength of the light. The first portion of the light has a first area. At least a portion of the blade structure is moved in a direction so that a second portion of the light within the illumination field impinges upon the blade structure. The second portion of the light has a second area, which is different from the first area. Moving the portion of the blade structure can decrease or increase the aggregate intensity of the light within the illumination field. Optionally, a desired intensity distribution of the light within the illumination field can be determined. The desired intensity distribution can be located at a reticle supported by a reticle stage of the photolithography system. The telecentricity of the light that impinges upon a wafer, supported by a wafer stage of the photolithography system, after moving the portion of the blade structure can be substantially the same as the telecentricity of the light that impinges upon the wafer before moving the portion of the blade structure.

The portion of the blade structure can be one of a plurality of portions. A first portion of the plurality of portions can move in a direction, while the position of a second portion of the plurality of portions can be maintained. Alternatively, the first portion of the plurality of portions can move in the direction by a first distance, while the second portion of the plurality of portions can move in the direction by a second distance. The second distance is different from the first distance. Movement of the first portion of the plurality of portions causes a third portion of the light within the illumination field to impinge upon the blade structure. Movement of the second portion of the plurality of portions causes a fourth portion of the light within the illumination field to impinge upon the blade structure. The third portion of the light has a third area and the fourth portion of the light has a fourth area. The second area is equal to a sum of the third area and the fourth area.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIGS. 27, 28, and 29 illustrate configurations of apparatus 1900 with alternative actuators.

The preferred embodiments of the invention are described with reference to the figures where like reference numbers indicate identical or functionally similar elements. Also in the figures, the left most digit of each reference number identifies the figure in which the reference number is first used.

DETAILED DESCRIPTION OF THE INVENTION

Figure 1:
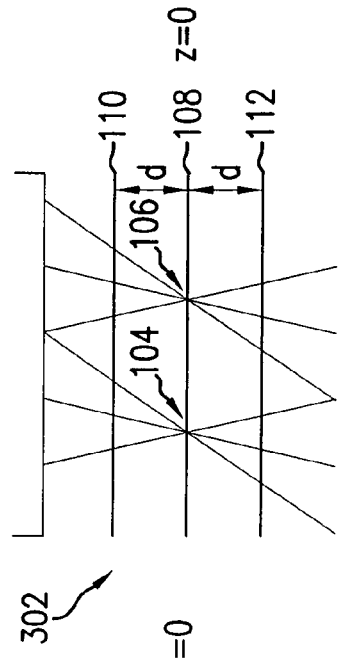
FIG. 1 illustrates a telecentric beam of light 102 with rays converging at a first point 104 and a second point 106 on a plane 108.
Figure 2:
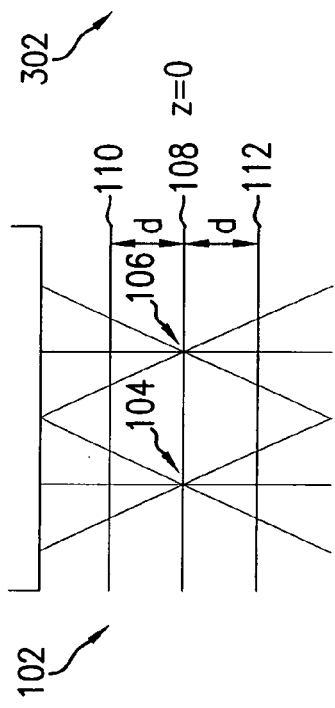
FIG. 2 illustrates intensity distributions 202, 204, and 206 for telecentric beam of light 102 at planes 108, 110, and 112.

The present invention relates to correcting variations in an intensity of light within an illumination field without distorting a telecentricity of the light. FIG. 1 illustrates a telecentric beam of light 102 with rays converging at a first point 104 and a second point 106 on a plane 108. Planes 110 and 112 are also shown. Plane 108 is a nominal image plane at z=0. Plane 110 is parallel to plane 108, but is a distance d closer to an illumination source (not shown) for beam of light 102. Plane 112 is also parallel to plane 108, but is a distance d further from the illumination source. FIG. 2 illustrates intensity distributions 202, 204, and 206 for telecentric beam of light 102 at planes 108, 110, and 112. Because beam of light 102 is telecentric, intensity distributions 202, 204, and 206 are aligned. In this situation, a distance D 208 between the areas of exposed photoresist for first point 104 and second point 106 is substantially the same regardless of the plane of the layer of photoresist for each point.

Figure 3:
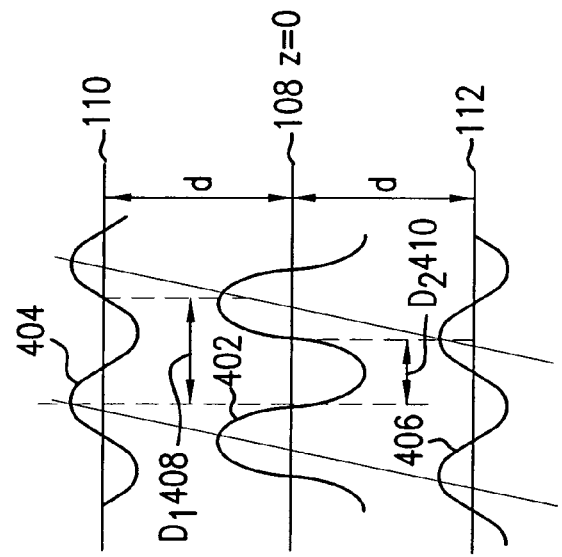
FIG. 3 illustrates a non-telecentric beam of light 302 with rays converging at first point 104 and second point 106 on plane 108.
Figure 4:
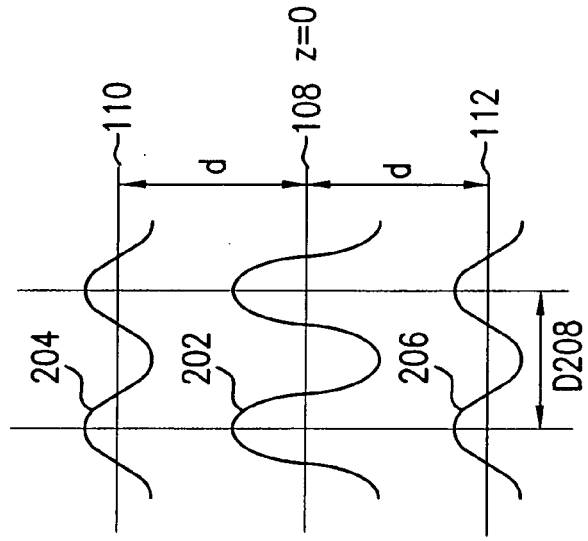
FIG. 4 illustrates intensity distributions 402, 404, and 406 for non-telecentric beam of light 302 at planes 108, 110, and 112.

FIG. 3 illustrates a non-telecentric beam of light 302 with rays converging at first point 104 and second point 106 on plane 108. FIG. 4 illustrates intensity distributions 402, 404, and 406 for non-telecentric beam of light 302 at planes 108, 110, and 112. Because beam of light 302 is non-telecentric, intensity distributions 402, 404, and 406 are not aligned. In this situation, distance D 208 between the areas of exposed photoresist for first point 104 and second point 106 differs depending upon the plane of the layer of photoresist for each point. For example, if the layer of photoresist for first point 104 is at plane 110 while the layer of photoresist for second point 106 is at plane 108, then distance D 208 measures $D_1$ 408. Alternatively, if the layer of photoresist for first point 104 is at plane 110 while the layer of photoresist for second point 106 is at plane 112, then distance D 208 measures $D_2$ 410. $D_2$ 410 is less than $D_1$ 408. Such differences in the distances between areas of exposed photoresist can cause undesirable variations in the positions or the feature sizes of fabricated devices. For this reason, it is important that the light that impinges upon the layer of photoresist be substantially telecentric.

Figure 5:
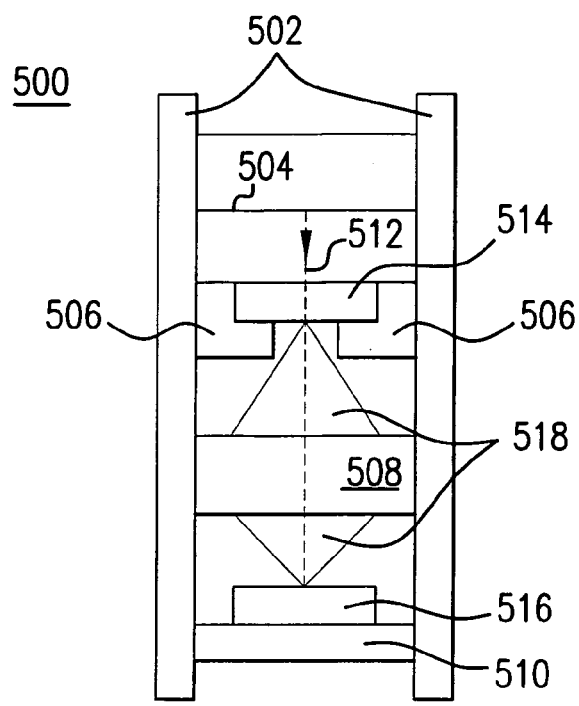
FIG. 5 illustrates an exemplary deep ultra violet (DUV) photolithography system 500.
Figure 6:
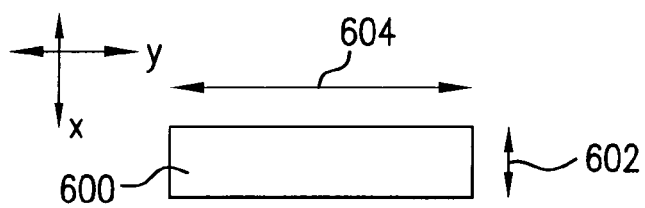
FIG. 6 illustrates an illumination field 600 for DUV photolithography system 500.

FIG. 5 illustrates an exemplary deep ultra violet (DUV) photolithography system 500. System 500 comprises a frame 502, a DUV illumination system 504, a reticle stage 506, projection optics 508, and a wafer stage 510. DUV illumination system 504, reticle stage 506, projection optics 508, and wafer stage 510 are positioned along an optical path 512. Reticle stage 506 is configured to support a reticle 514. Wafer stage 510 is configured to support a wafer 516. DUV illumination system 504 typically produces a DUV beam 518 having a wavelength of 248 nm, 193 nm, or 157 nm. Diffraction causes DUV beam 518 to diverge as it passes through reticle 514. Projection optics 508 cause DUV beam 518 to converge at wafer 516. The skilled artisan appreciates that smaller feature sizes can be realized by increasing the numerical aperture of system 500. System 500 can be configured so that DUV beam 518 has a numerical aperture of about 0.8. FIG. 6 illustrates an illumination field 600 for DUV photolithography system 500. Illumination field 600 is typically shaped as a rectangle and has a width 602 and a length 604.

Figure 7:
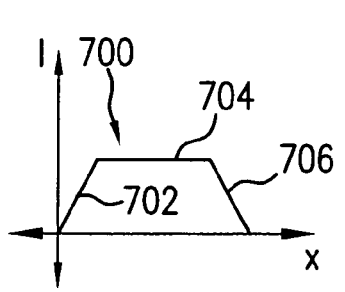
FIG. 7 illustrates an exemplary intensity distribution 700 along width 602.

FIG. 7 illustrates an exemplary intensity distribution 700 along width 602. Usually intensity distribution 700 has a trapezoidal (or Gaussian) shape. Because scanning typically occurs along width 602 (here labeled the x-axis), a given point in reticle 514 will, over the course of a scan, be exposed to intensities from each of a rising portion 702, a constant portion 704, and a falling portion 706 of intensity distribution 600. Thus, by completion of the scan, each point in reticle 514 along a line parallel to the x-axis will be exposed to the same cumulative intensity.

Figure 8:
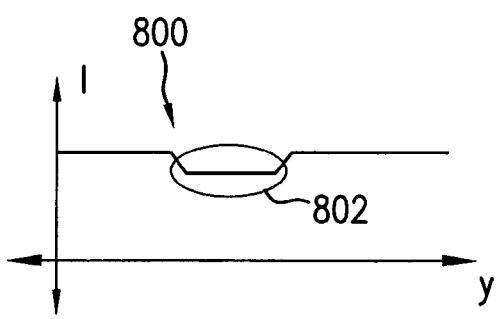
FIG. 8 illustrates an exemplary intensity distribution 800 along length 604.

FIG. 8 illustrates an exemplary intensity distribution 800 along length 604. Because length 604 can be substantially longer than width 602, there is a greater likelihood for significant undesirable variations in the intensity along length 604. Here, intensity distribution 800 has a nonuniform portion 802, which is shown, for example, as an undesirable reduction in the intensity of the light. Because scanning does not occur along length 604 (here labeled the y-axis), there is not an opportunity to compensate for these variations by having each point in the layer of photoresist along a line parallel to the y-axis exposed to the same cumulative intensity. Thus, undesirable variations in the intensity of the light along length 604 need to be corrected.

Figure 9:
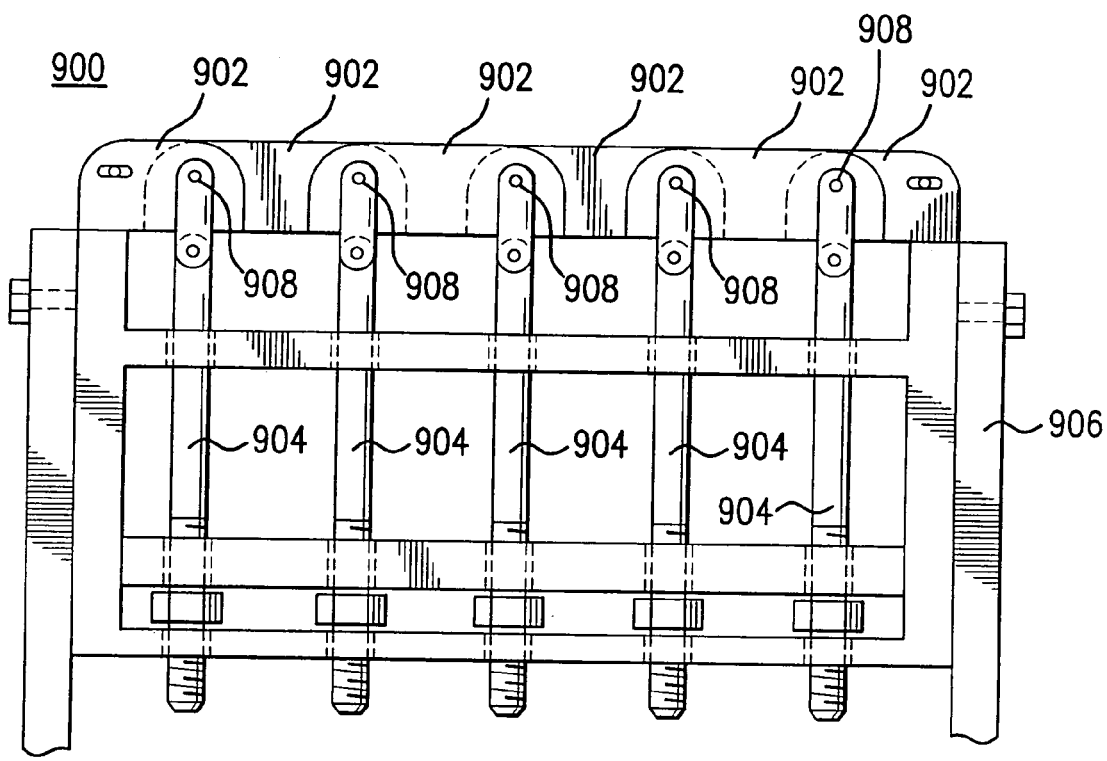
FIGS. 9 and 10 illustrate an example dynamically adjustable slit device 900 as disclosed in U.S. Pat. No. 6,097,474.
Figure 10:
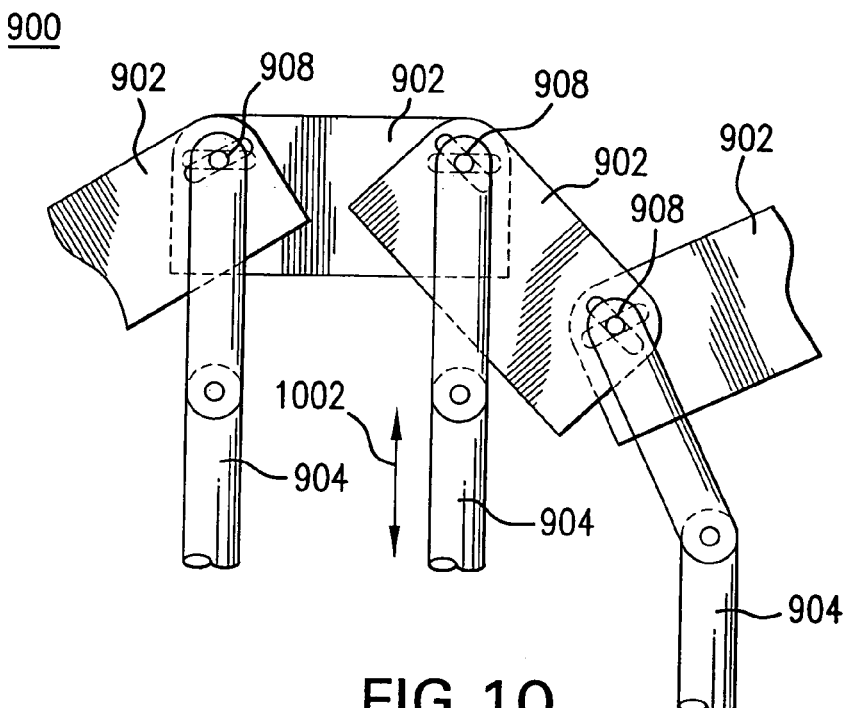

U.S. Pat. No. 6,097,474 to McCullough et al., entitled "Dynamically Adjustable High Resolution Adjustable Slit", which is incorporated herein in its entirety by reference, discloses apparatuses and methods for correcting variations in the intensity of the light within illumination field 600. FIGS. 9 and 10 illustrate an exemplary dynamically adjustable slit device 900 as disclosed in U.S. Pat. No. 6,097,474. Device 900 comprises blades 902, push rods 904, and a frame 906. Each blade 902 is configured to be used to block a corresponding portion of the light within illumination field 600. Push rods 904 are coupled to blades 902 by pins 908. Each push rod 904 is configured to be individually positioned by an adjustable drive (not shown). The adjustable drive can comprise a solenoid or the like (not shown). Frame 906 supports and guides push rods 904 so that they can move along the x-axis as shown by arrows 1002. In order not to distort the pattern transferred from reticle 514 to illumination field 600, device 900 is positioned along the optical path between DUV illumination system 504 and reticle stage 506 (i.e., before the beam of light impinges reticle 514).

Figure 11:
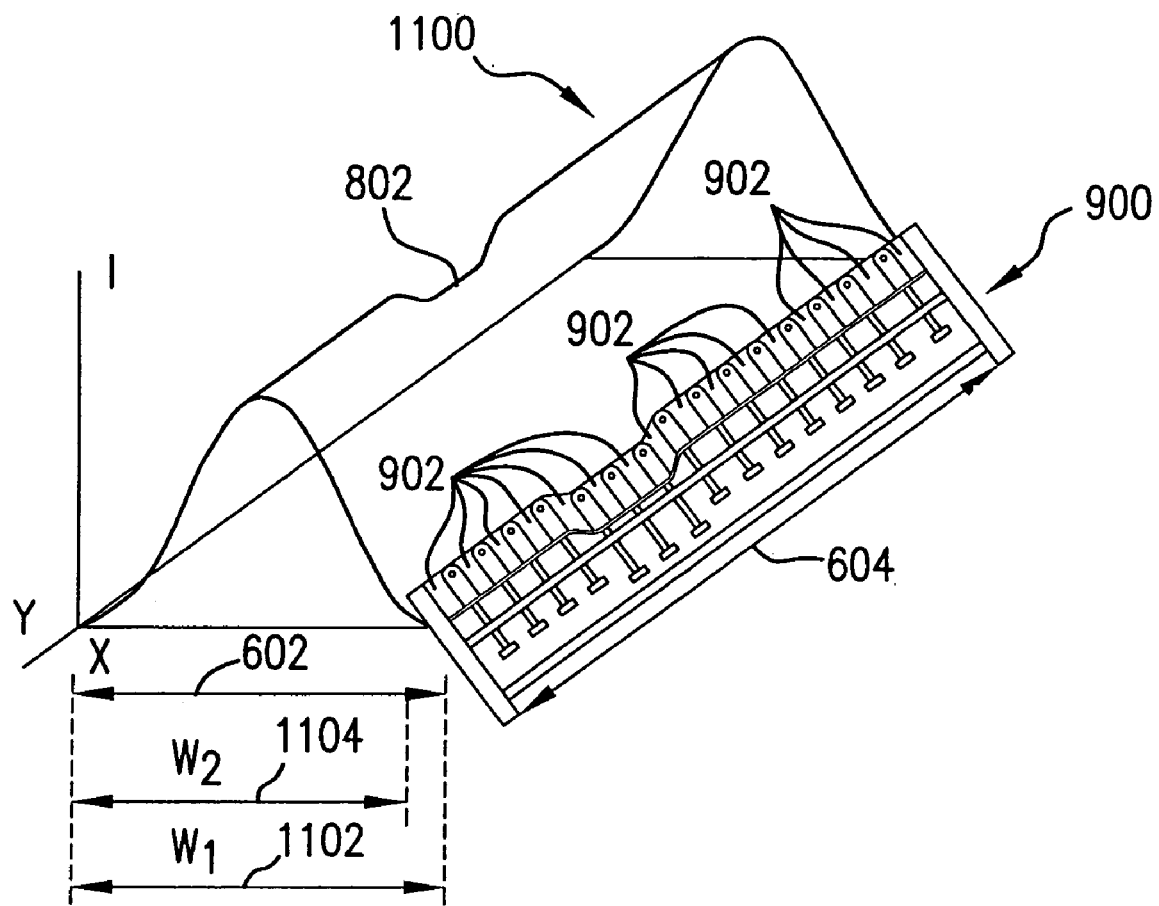
FIG. 11 illustrates how device 900 is used to correct variations in an intensity of light within illumination field 600.

FIG. 11 illustrates how device 900 can be used to correct variations in the intensity of the light within illumination field 600. Exemplary intensity distribution 1100 is shown, which is a three-dimensional presentation of exemplary intensity distributions 700 and 800. (Intensity distribution 700 is shown with a Gaussian shape.) Blades 902 are distributed along length 604 and configured to reduce, by blocking a corresponding portion of the light within illumination field 600, the measure of width 602 at those locations where the intensity of the light needs to be reduced in order to correct intensity distribution 800. For example, those blades 902 that do not correspond to the location of nonuniform portion 802 are positioned to reduce the measure of width 602 from $W_1$ 1102 to $W_2$ 1104, while those blades 902 that correspond to the location of nonuniform portion 802 are positioned to maintain the measure of width 602 at $W_1$ 1102. Thus, by completion of the scan, each point in reticle 514 along a line parallel to the x-axis that is positioned along a line parallel to the y-axis that corresponds to the location of nonuniform portion 802 will be exposed to the light for a longer period of time than will each point in reticle 514 along a line parallel to the x-axis that is positioned along a line parallel to the y-axis that does not correspond to the location of nonuniform portion 802. However, because the intensity of the light that corresponds to the location of nonuniform portion 802 is less than the intensity of the light that does not correspond to the location of nonuniform portion 802, each point in reticle 514 will be exposed to substantially the same cumulative intensity. In this manner, device 900 can be used to correct variations in the intensity of the light within illumination field 600.

Dynamically adjustable slit device 900 can be used in the manner described above when the illumination system that produces the beam of light is configured to control pupil fill. Such an illumination system is disclosed, for example, in U.S. Pat. No. 5,631,721 to Stanton et al., entitled "Hybrid Illumination System for Use in Photolithography", which is incorporated herein in its entirety by reference. The illumination system of U.S. Pat. No. 5,631,721 has a multi-image optical element and an array optical element to control pupil fill. The multi-image optical element can be a microlens array having a plurality of refractive lens elements or a diffractive optical element. The array optical element is a two dimensional periodic and/or quasi-periodic array of micro optical elements which use diffraction and/or refraction to control wave fronts. The array optical element can be made of transmissive or reflective materials.

Figure 12:
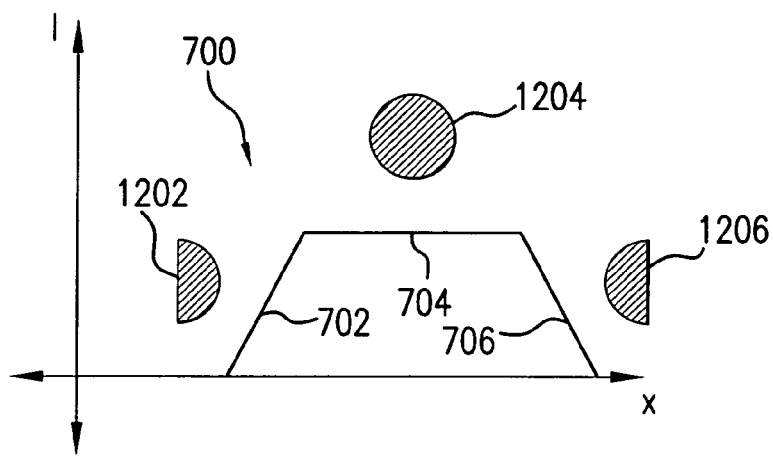
FIG. 12 illustrates pupil fills across intensity distribution 700 when it is produced by an illumination system that is configured to control pupil fill.

FIG. 12 illustrates pupil fills across intensity distribution 700 when it is produced by an illumination system that is configured to control pupil fill. Under such circumstances, rising portion 702 has a partial pupil fill 1202, constant portion 704 has a full pupil fill 1204, and falling portion 706 has a partial pupil fill 1206. Furthermore, the ability of the illumination system to control pupil fill allows blades 902 of device 900 to reduce the measure of width 602 from just one side (i.e., rising portion 702 or falling portion 706) of intensity distribution 700 while maintaining symmetry in the configuration of the pupil fills across intensity distribution 700.

Figure 13:
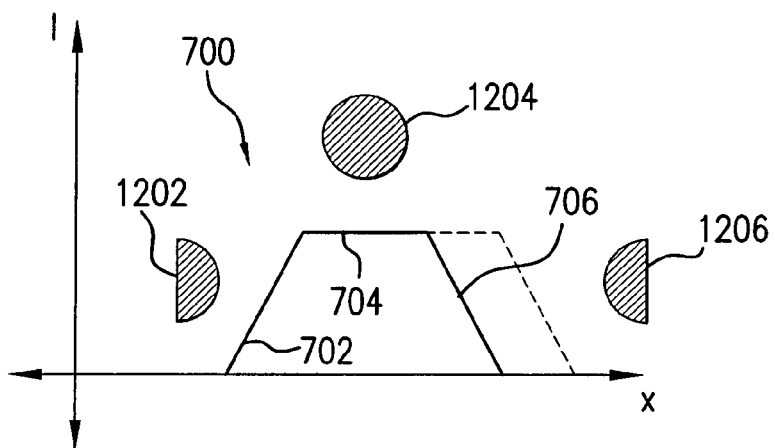
FIG. 13 illustrates pupil fills across intensity distribution 700 when it is produced by an illumination system that is configured to control pupil fill and blades 902 have reduced the measure of width 602 from the side of falling portion 706.

FIG. 13 illustrates pupil fills across intensity distribution 700 when it is produced by an illumination system that is configured to control pupil fill and blades 902 have reduced the measure of width 602 from the side of falling portion 706. The reduction of the measure of width 602 is realized as a reduction of the measure of the width of constant portion 704. Rising portion 702 maintains partial pupil fill 1202, constant portion 704 maintains full pupil fill 1204, and falling portion 706 maintains partial pupil fill 1206. The skilled artisan recognizes that maintaining symmetry in the configuration of the pupil fills across intensity distribution 700 preserves the telecentricity of the light that impinges upon the layer of photoresist.

Figure 14:
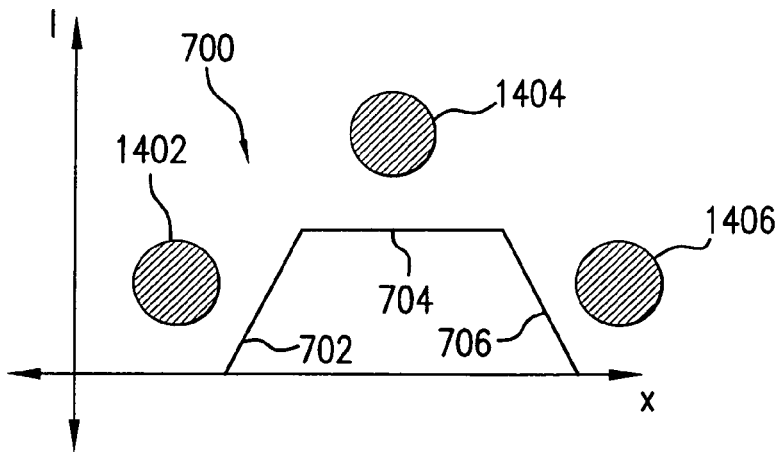
FIG. 14 illustrates pupil fills across intensity distribution 700 when it is produced by an illumination system that is not configured to control pupil fill.

FIG. 14 illustrates pupil fills across intensity distribution 700 produced by an illumination system that is not configured to control pupil fill. Under such circumstances, rising portion 702 has a full pupil fill 1402, constant portion 704 has a full pupil fill 1404, and falling portion 706 has a full pupil fill 1406. Here, reducing the measure of width 602 from just one side (i.e., rising portion 702 or falling portion 706) of intensity distribution 700 causes the configuration of the pupil fills across intensity distribution 700 to become asymmetric.

Figure 15:
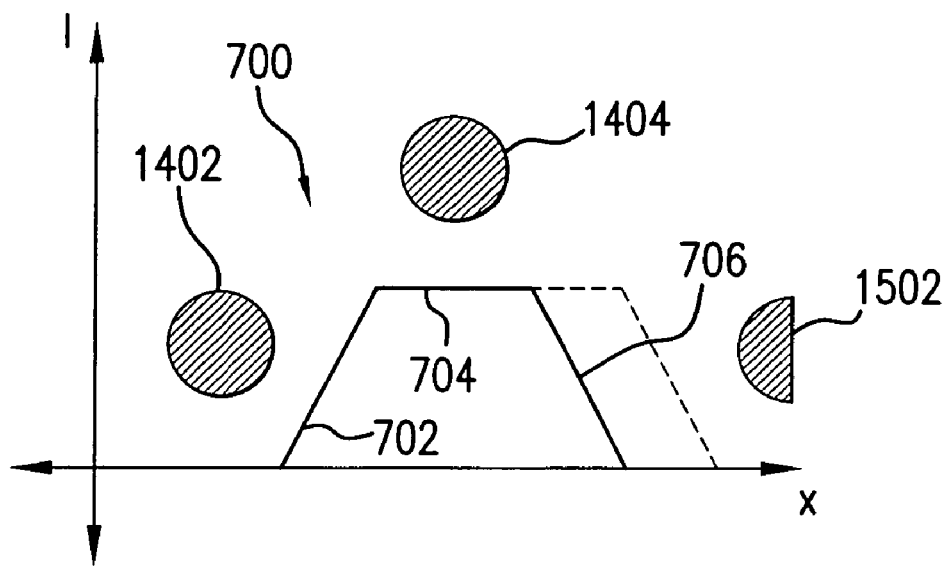
FIG. 15 illustrates pupil fills across intensity distribution 700 when it is produced by an illumination system that is not configured to control pupil fill and blades 902 have reduced the measure of width 602 from the side of falling portion 706.

FIG. 15 illustrates pupil fills across intensity distribution 700 when it is produced by an illumination system that is not configured to control pupil fill and blades 902 have reduced the measure of width 602 from the side of falling portion 706. The reduction of the measure of width 602 again is realized as a reduction of the measure of the width of constant portion 704. Rising portion 702 maintains full pupil fill 1402 and constant portion 704 maintains full pupil fill 1404. Unfortunately, falling portion 706 now has a partial pupil fill 1502. The skilled artisan recognizes that causing the pupil fill configuration across intensity distribution 700 to become asymmetric distorts the telecentricity of the light that impinges upon the layer of photoresist.

Figure 16:
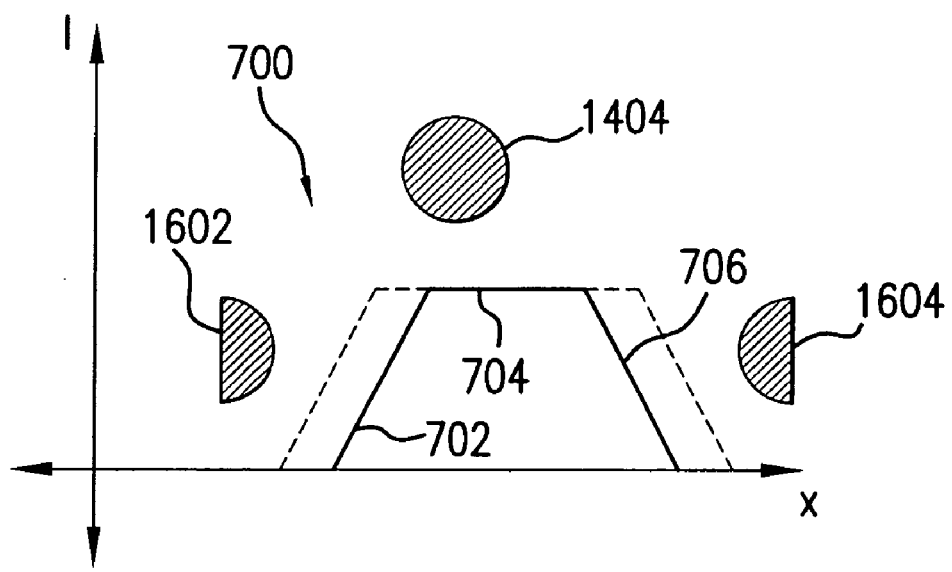
FIG. 16 illustrates pupil fills across intensity distribution 700 when it is produced by an illumination system that is not configured to control pupil fill and blades 902 have reduced the measure of width 602 from both the side of rising portion 702 and the side of falling portion 706.

However, the telecentricity of the light that impinges upon the layer of photoresist can be preserved if blades 902 reduce the measure of width 602 from both sides (i.e., rising portion 702 and falling portion 706) of intensity distribution 700. FIG. 16 illustrates pupil fills across intensity distribution 700 when it is produced by an illumination system that is not configured to control pupil fill and blades 902 have reduced the measure of width 602 from both the side of rising portion 702 and the side of falling portion 706. The reduction of the measure of width 602 again is realized as a reduction of the measure of the width of constant portion 704. Constant portion 704 maintains full pupil fill 1404, but rising portion 702 now has a partial pupil fill 1602 and falling portion 706 now has a partial pupil fill 1604. Although the configuration of the pupil fills across intensity distribution 700 has changed, the configuration remains symmetric. The skilled artisan recognizes that maintaining symmetry in the configuration of the pupil fills across intensity distribution 700 preserves the telecentricity of the light that impinges upon the layer of photoresist.

Figure 17:
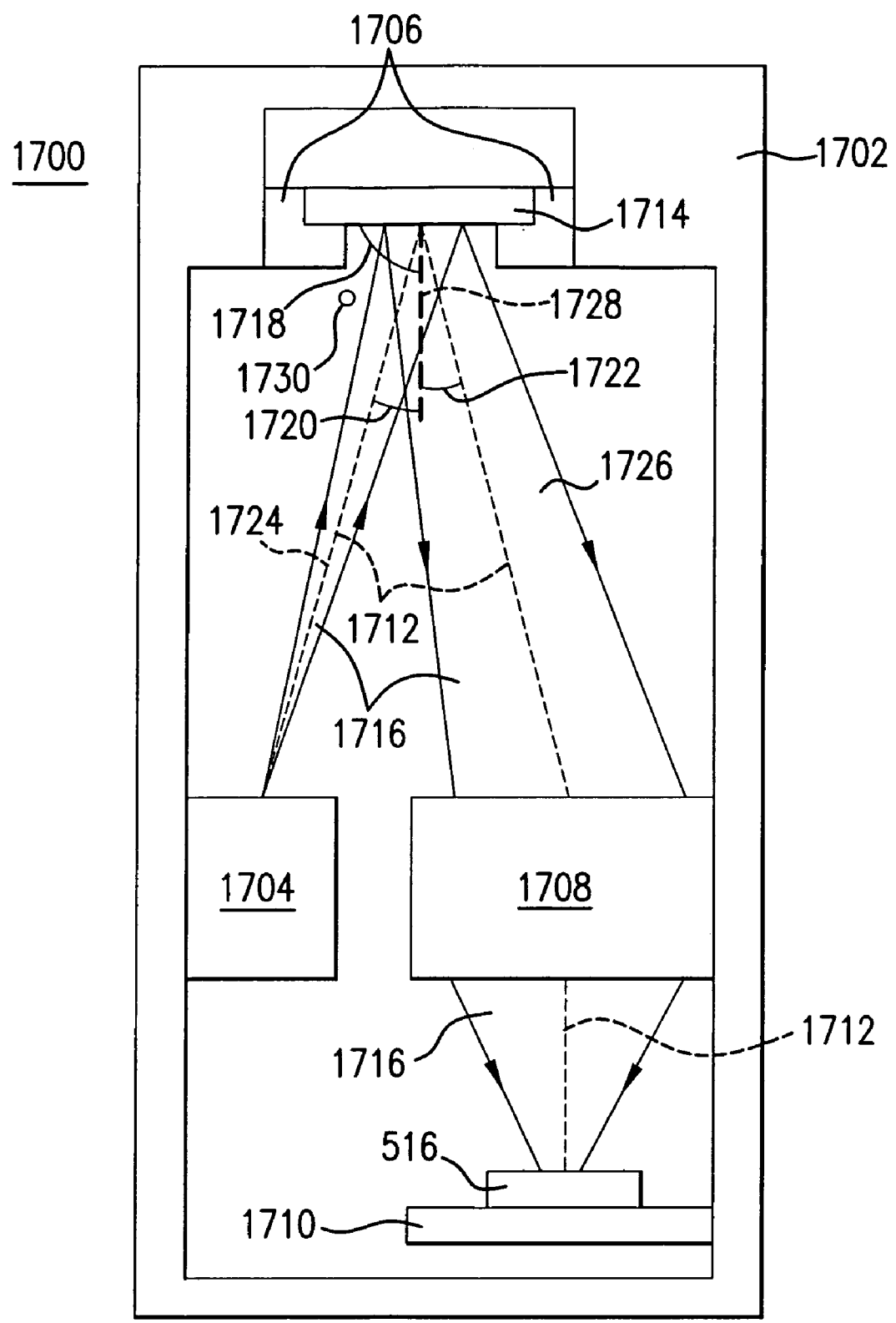
FIG. 17 illustrates a potential extreme ultra violet (EUV) photolithography system 1700.

FIG. 17 illustrates a potential extreme ultra violet (EUV) photolithography system 1700. System 1700 comprises a frame 1702, an EUV illumination system 1704, a reticle stage 1706, projection optics 1708, and a wafer stage 1710. EUV illumination system 1704, reticle stage 1706, projection optics 1708, and wafer stage 1710 are positioned along an optical path 1712. Reticle stage 1706 is configured to support a reflective reticle 1714. Wafer stage 1710 is configured to support wafer 516. System 1700 is expected to produce an EUV beam 1716 having wavelengths between 10 nm to 15 nm. Using EUV light for photolithography presents several challenges. EUV light is strongly absorbed by most materials. Thus, EUV photolithography system 1700 maintains vacuum conditions along optical path 1712 (gasses absorb EUV light) and uses reflective (rather than refractive) optical elements for projection optics 1708 and for EUV illumination system 1704.

Figure 18:
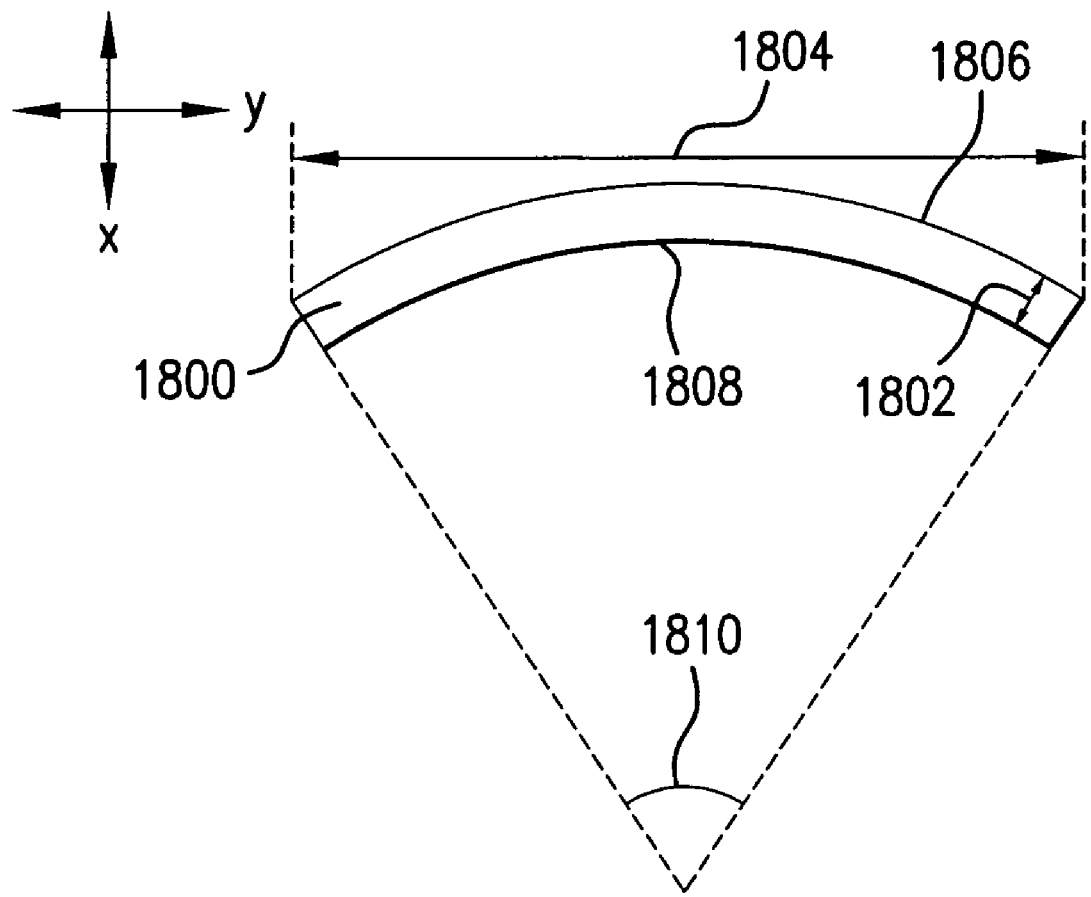
FIG. 18 illustrates an illumination field 1800 for EUV photolithography system 1700.

FIG. 18 illustrates an illumination field 1800 for EUV photolithography system 1700. Illumination field 1800 is shaped as an annulus sector and has a width 1802, a length 1804, an outer arc 1806, an inner arc 1808, and an angle of arc 1810. Length 1804 can be measured from the ends of outer arc 1806. An exemplary intensity distribution along width 1802 can be substantially the same as intensity distribution 700 (i.e., having a trapezoidal or Gaussian shape). Scanning typically occurs along width 1802 (here labeled the x-axis). An exemplary intensity distribution along arcs of illumination field 1800 (e.g., outer arc 1806, inner arc 1808, or any interior arc) can be substantially the same as intensity distribution 800. Because scanning does not occur along length 1804 (here labeled the y-axis), undesirable variations in the intensity of the light along arcs of illumination field 1800 need to be corrected.

In order for the pattern of reflective reticle 1714 to be transferred to illumination field 1800 with a high degree of fidelity, EUV beam 1716 that impinges upon reflective reticle 1714 should be at an average angle 1718 nearly normal to the plane of reflective reticle 1714. If average angle 1718 is too oblique, the pattern of reflective reticle 1714 may be distorted; if average angle 1718 is exactly normal to the plane of reflective reticle 1714, EUV beam 1716 will be reflected back to EUV illumination system 1704 rather than to projection optics 1708. In a representative embodiment of system 1700, EUV beam 1716 impinges upon reflective reticle 1714 at an average incident angle 1720 of, for example, six degrees from normal and is reflected back at an average opposite angle 1722 of the same measurement. Thus, a sum of angles 1720 and 1722 between a portion 1724 of EUV beam 1716 that impinges upon reflective recticle 1714 and a portion 1726 of EUV beam 1716 that is reflected from reflective reticle 1714 is, for example, twelve degrees.

Because angle 1718 is less than normal to the plane of reflective reticle 1714, EUV illumination system 1704 causes portion 1724 of EUV beam 1716 to diverge en route to reflective reticle 1714. Upon reflection from reflective reticle 1714, diffraction causes portion 1726 of EUV beam 1716 to diverge further en route to projection optics 1708. It is anticipated that EUV beam 1716 of system 1700 will have a numerical aperture between about 0.1 and 0.3. A consequence of the divergence of EUV beam 1716 is that the shape of intensity distribution 700 of EUV beam 1716 varies along optical path 1712. Near EUV illumination source 1704, rising portion 704 and falling portion 706 of intensity distribution 700 are characterized by more gradual angles and consume a larger portion of the overall distribution. In contrast, near reflective reticle 1714, rising portion 704 and falling portion 706 are characterized by sharper angles and consume a smaller portion of the overall distribution. The skilled artisan recognizes that it is more desirable to correct undesirable variations in the intensity of the light along arcs of illumination field 1800 near reflective reticle 1714. However, another consequence of the divergence of EUV beam 1716 is that, near reflective reticle 1714, portion 1724 and portion 1726 are superimposed upon each other at a first space 1728. This precludes the ability to place dynamically adjustable slit device 900 in first space 1728 for use in reducing the measure of width 1802 from this side of portion 1724 (in conjunction with another dynamically adjustable slit device 900 placed at a second space 1730 for reducing the measure of width 1802 from the other side of portion 1724). Furthermore, an EUV illumination system configured to control pupil fill in a manner similar to the DUV illumination system disclosed, for example, in U.S. Pat. No. 5,631,721 (which would allow the measure of width 1802 to be reduced from just one side of portion 1724) has not been developed.

Figure 19:
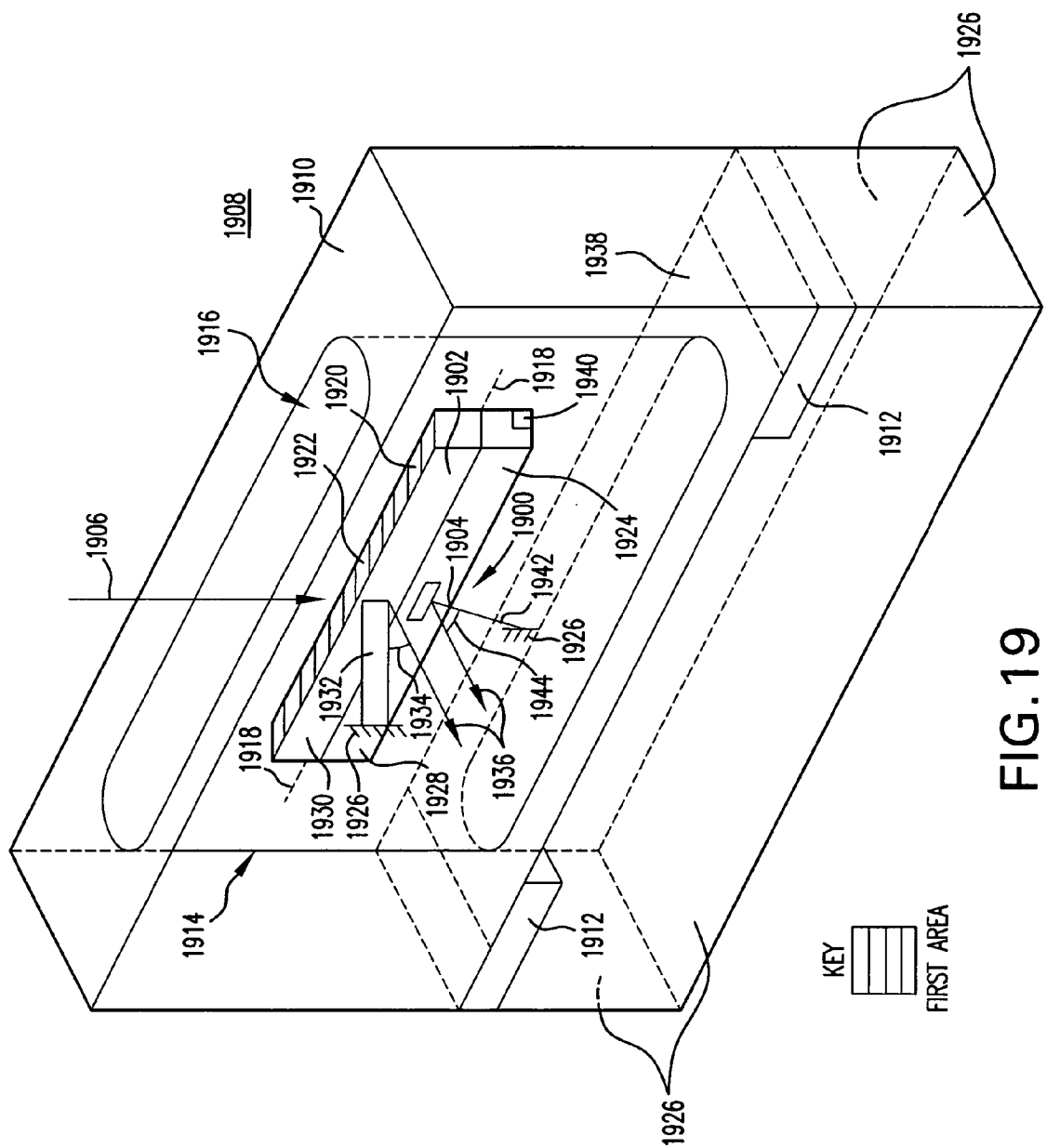
FIGS. 19 and 20 illustrate an apparatus 1900 in the manner of the present invention.
Figure 20:
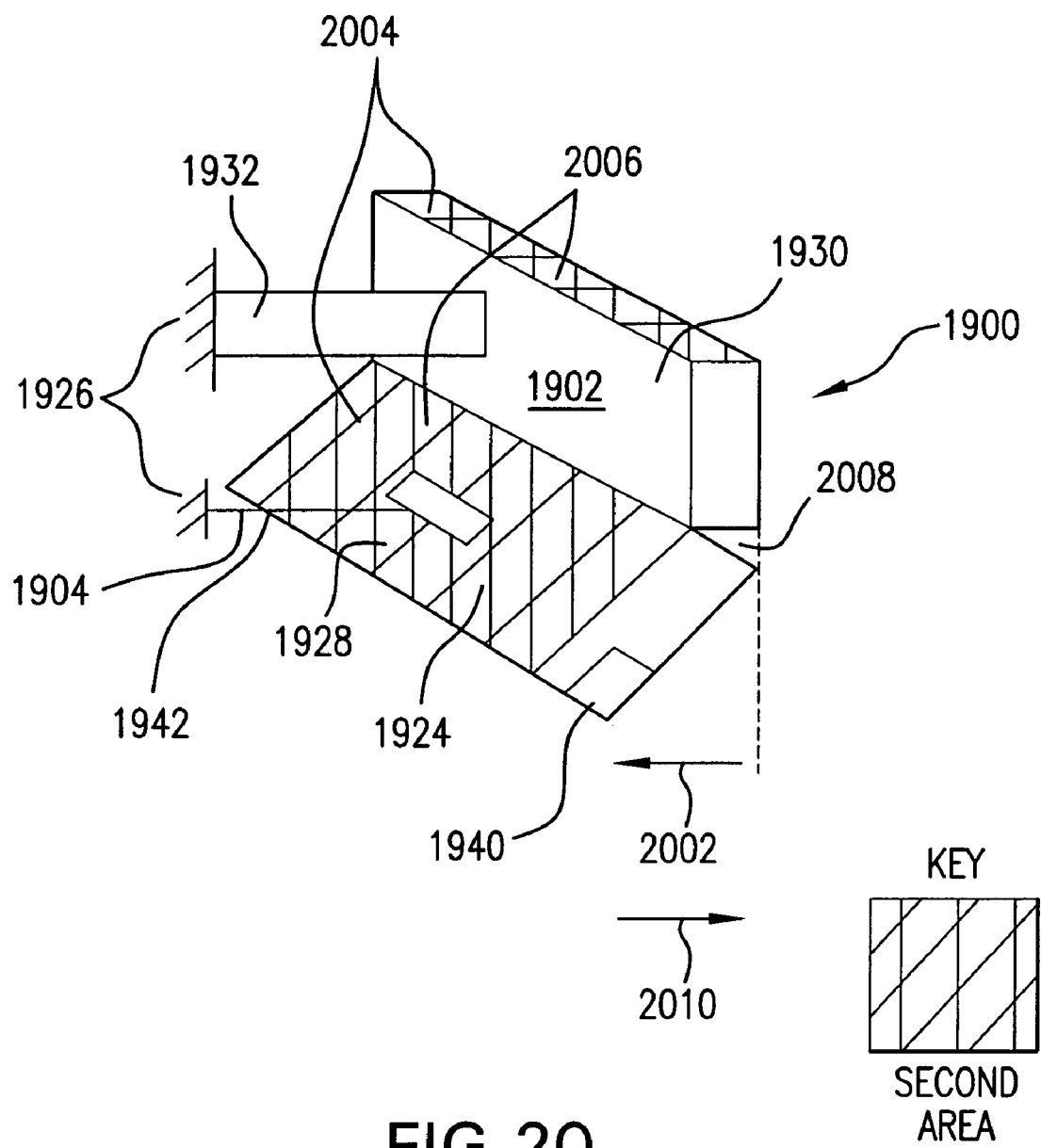

FIGS. 19 and 20 illustrate an apparatus 1900 in the manner of the present invention. Apparatus 1900 comprises a blade structure 1902 and a first actuator 1904. Blade structure 1902 is configured to be positioned along an optical path 1906 of a photolithography system 1908 between an illumination system 1910 of photolithography system 1908 and a reticle stage 1912 of photolithography system 1908 so that, when illumination system 1910 provides a light 1914 having an illumination field 1916, blade structure 1902 is substantially at a center 1918 of illumination field 1916. Blade structure 1902 is either translucent or opaque to a wavelength of light 1914. FIG. 19 shows apparatus 1900 before blade structure 1902 has been moved by first actuator 1904. In this configuration, a first portion 1920 of light 1914 within illumination field 1916 impinges upon blade structure 1902. First portion 1920 of light 1914 has a first area 1922. Preferably, first area 1922 is as minimal as practical to limit the extent to which blade structure 1902 blocks light 1914 in illumination field 1916.

First actuator 1904 is coupled between a first portion 1924 of blade structure 1902 and a frame 1926 of photolithography system 1908 and is configured to move at least first portion 1924 of blade structure 1902 in a first direction 2002. FIG. 20 shows apparatus 1900 after blade structure 1902 has been moved by first actuator 1904. When illumination system 1910 provides light 1914 having illumination field 1916, a second portion 2004 of light 1914 within illumination field 1916 impinges upon blade structure 1902. Second portion 2004 of light 1914 has a second area 2006. Second area 2006 is different from first area 1922.

Figure 21:
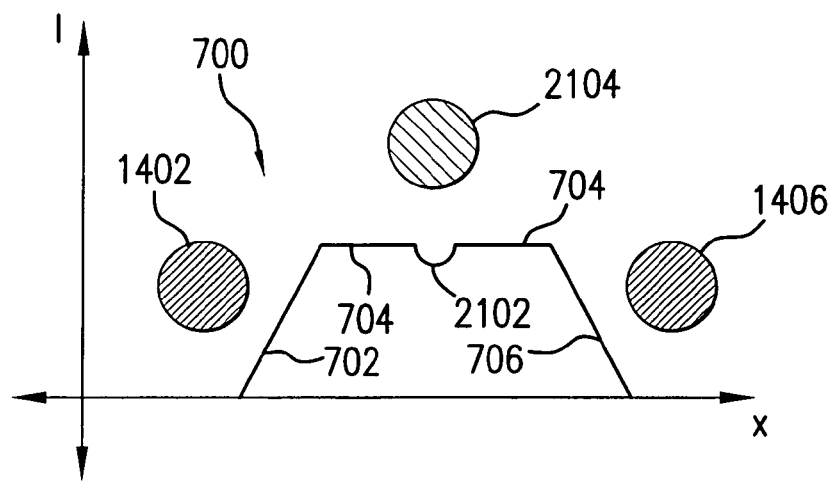
FIG. 21 illustrates pupil fills across intensity distribution 700 when it is produced by an illumination system that is not configured to control pupil fill and apparatus 1900 is used to correct undesirable variations in the intensity of the light in intensity distribution 800.

FIG. 21 illustrates pupil fills across intensity distribution 700 when it is produced by an illumination system that is not configured to control pupil fill and apparatus 1900 is used to correct undesirable variations in the intensity of the light in intensity distribution 800. Apparatus 1900 does not reduce the measure of width 602, but rather causes a slight decrease 2102 in the intensity near a center of constant portion 704. Rising portion 702 maintains full pupil fill 1402 and falling portion 706 maintains full pupil fill 1406. However, constant portion 704 now has a full pupil fill with a decreased intensity 2104. Although the configuration of the pupil fills across intensity distribution 700 has changed, the configuration remains symmetric. The skilled artisan recognizes that maintaining symmetry in the configuration of the pupil fills across intensity distribution 700 preserves the telecentricity of the light that impinges upon the layer of photoresist. Thus, apparatus 1900 corrects variations in the intensity of the light within an illumination field without distorting the telecentricity of the light.

Figure 22:
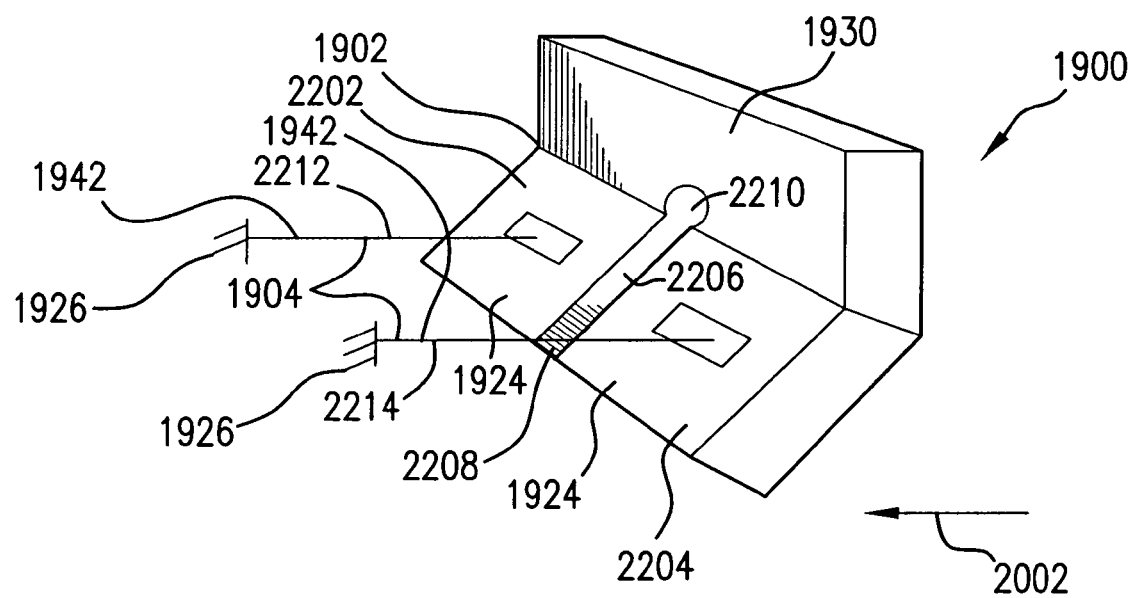
FIGS. 22, 23, and 24 illustrate a configuration of apparatus 1900 in which flap 1928 comprises a plurality of flaps.
Figure 23:
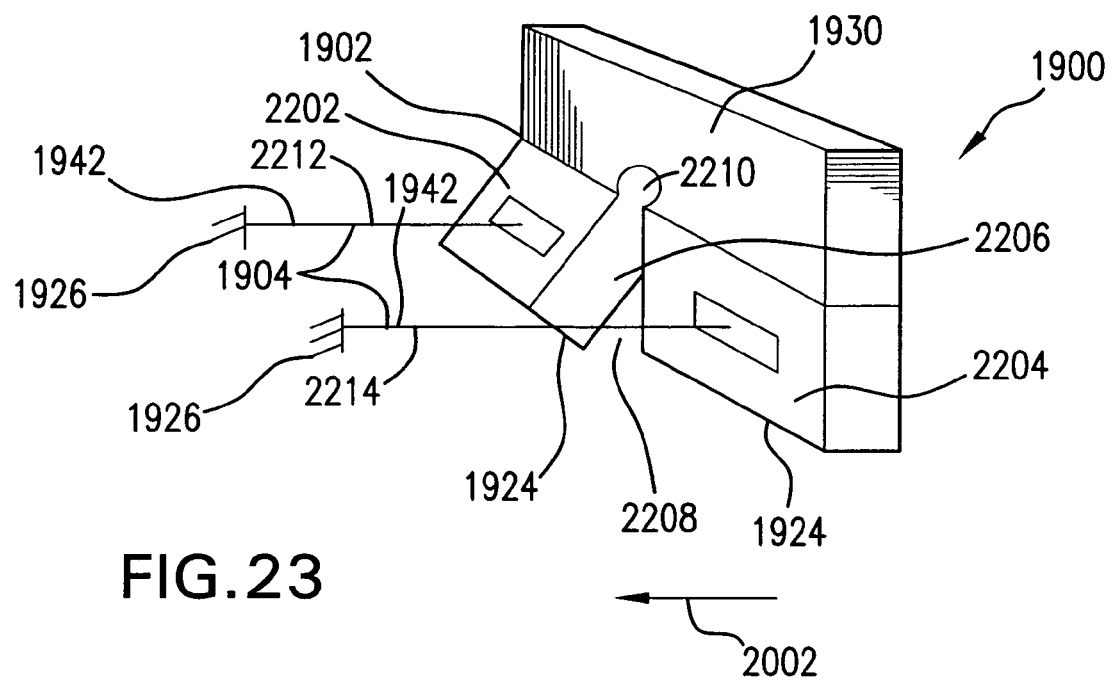
Figure 24:
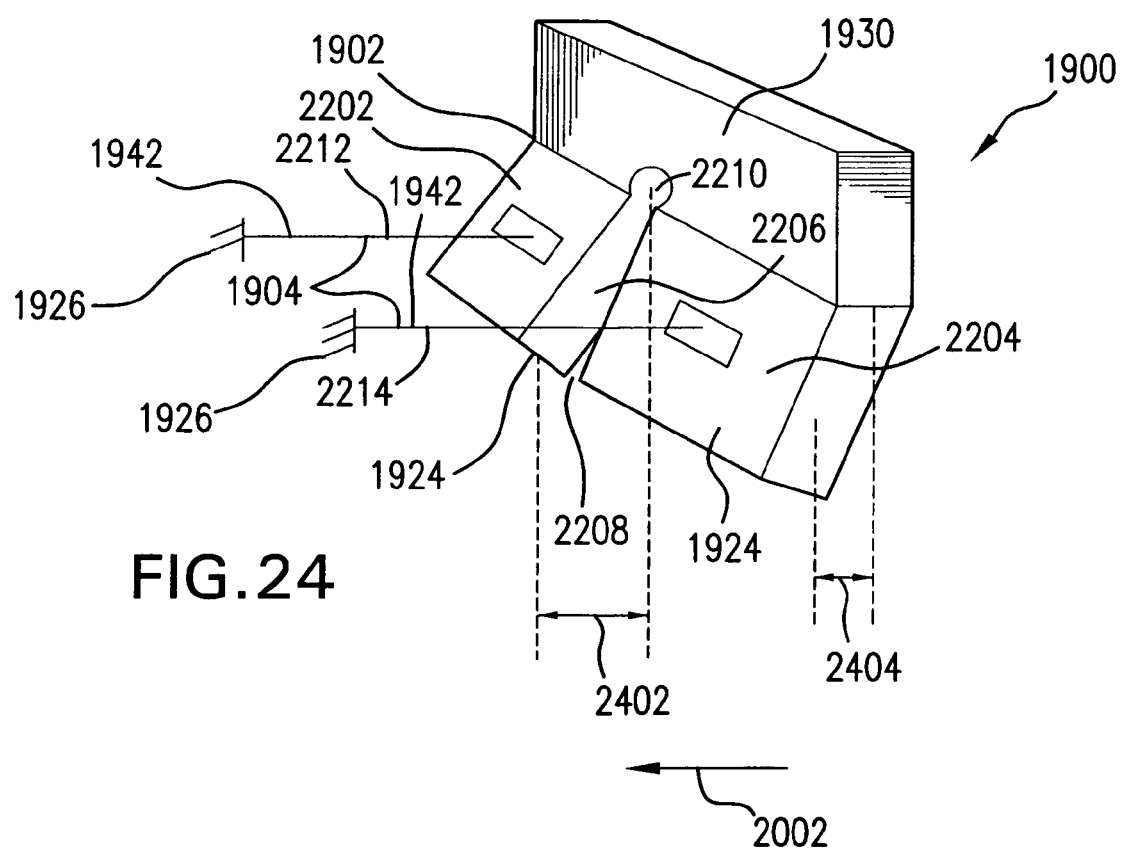

Returning to FIGS. 19 and 20, first portion 1924 of blade structure 1902 can be, but is not necessarily, a flap 1928. Flap 1928 can be coupled to a second portion 1930 of blade structure 1902. Flap 1928 can be, but is not necessarily, coupled to second portion 1930 by a hinge 2008. FIGS. 22, 23, and 24 illustrate a configuration of apparatus 1900 in which flap 1928 comprises a plurality of flaps. In the configuration of apparatus 1900 shown at FIGS. 22, 23, and 24, a first flap 2202 of the plurality of flaps is separated from a second flap 2204 of the plurality of flaps by a slit 2206. Slit 2206 has an open end 2208 and a closed end 2210. Closed end 2210 can have a shape to reduce stress at closed end 2210. For example, the shape can be a keyhole shape.

Furthermore, first actuator 1904 can comprise a plurality of first actuators. For example, at FIG. 22, a first actuator 2212 of the plurality of first actuators can be coupled between first flap 2202 and frame 1926 and configured to move first flap 2202 in first direction 2002 and a second actuator 2214 of the plurality of first actuators can be coupled between second flap 2204 and frame 1926 and configured to move second flap 2204 in first direction 2002. Control of first actuator 2212 can be independent of control of second actuator 2214. At FIG. 23, for example, first actuator 2212 can move first flap 2202 in first direction 2002, while second actuator 2214 can maintain second flap 2204 at its position. In another example, at FIG. 24, first actuator 2212 can move first flap 2202 in first direction 2002 by a first distance 2402, while second actuator 2214 can move second flap 2204 in first direction 2002 by a second distance 2404.

Figure 25:
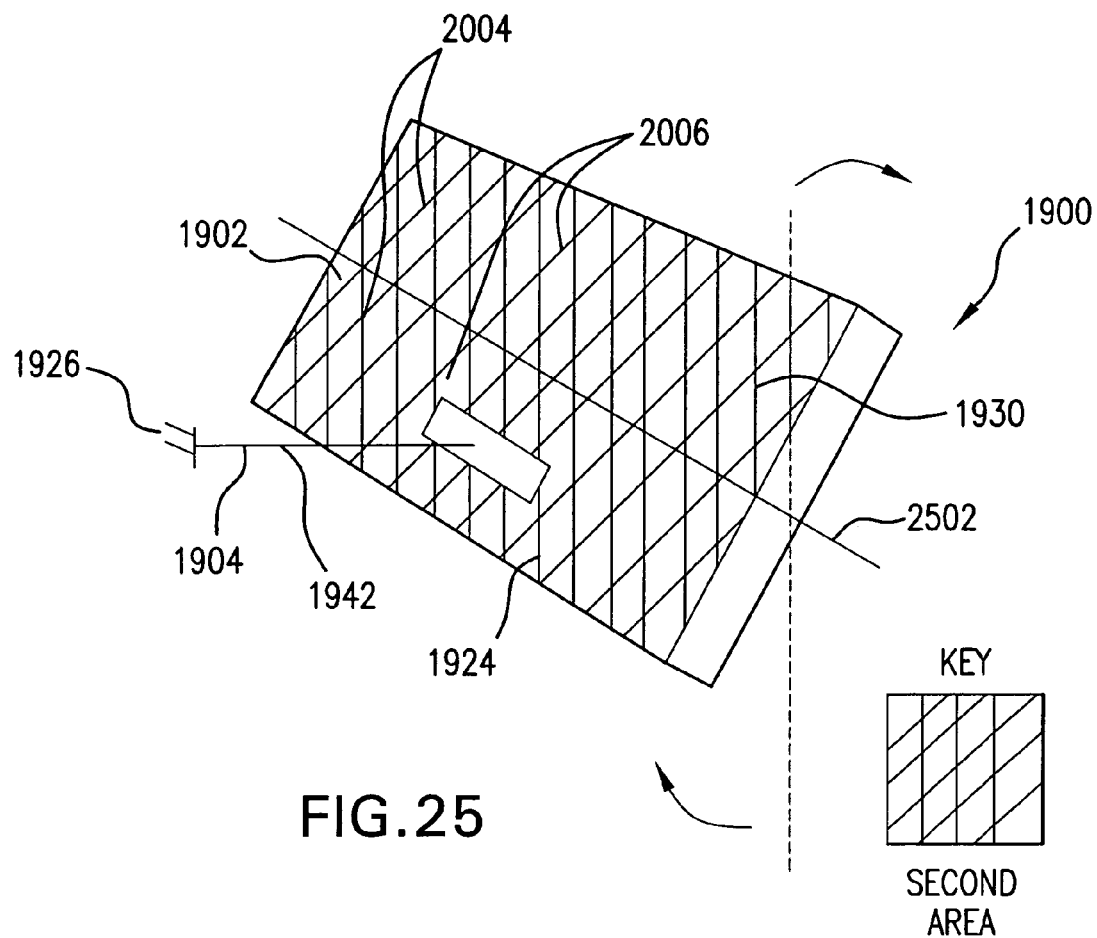
FIG. 25 illustrates an alternative configuration of first portion 1924 and second portion 1930 of blade structure 1902.

FIG. 25 illustrates an alternative configuration of first portion 1924 and second portion 1930 of blade structure 1902. At FIG. 25, blade structure 1902 is rigid and configured to rotate about a center 2502 (defined by a line, an arc, or the like) that distinguishes first portion 1924 from second portion 1930. Here, first actuator 1904 can be configured to move both first portion 1924 and second portion 1930 in first direction 2002.

Returning to FIGS. 19 and 20, apparatus 1900 can further comprise a strut 1932 coupled between second portion 1930 and frame 1926. An angle 1934 can be formed between strut 1932 and a direction 1936 in which reticle stage 1912 is configured to move. Angle 1934 can be different from zero degrees. Over the course of a scan, having angle 1934 different from zero degrees prevents a given point in a reticle 1938 from being continuously blocked from light 1914 by strut 1932.

Figure 26:
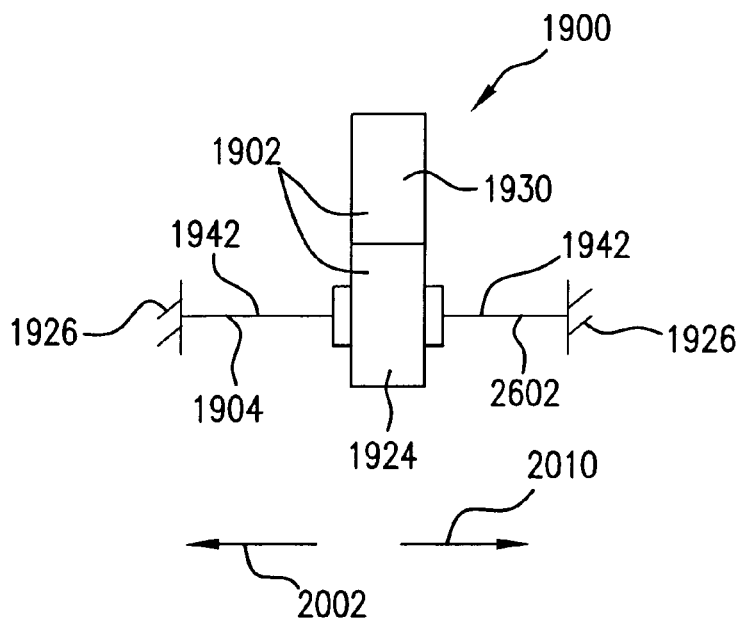
FIG. 26 illustrates a configuration of apparatus 1900 further comprising a second actuator 2602.

First actuator 1904 can be further configured to move at least first portion 1924 of blade structure 1902 in a second direction 2010. Second direction 2010 is opposite first direction 2002. Alternatively, at least first portion 1924 can be configured to move in second direction 2010 via a gravitational force. First portion 1924 can, for example, have a part 1940 with sufficient mass to provide the gravitational force. Alternatively, blade structure 1902 can be made of at least an elastic material and at least first portion 1924 can be configured to move in second direction 2010 via an elastic restoring force. The elastic material can be at least one of stainless steel, silver, nickel, aluminum, copper, silicon, and the like. Alternatively, FIG. 26 illustrates a configuration of apparatus 1900 further comprising a second actuator 2602. Here, first actuator 1904 can be configured to move first portion 1924 in first direction 2002 and second actuator 2602 can be configured to move first portion 1924 in second direction 2010.

Returning to FIGS. 19 and 20, first actuator 1904 can be a mechanical actuator. The mechanical actuator can have a wire 1942 coupled to first portion 1924 of blade structure 1902. Wire 1942 can be rigid so that first actuator 1904 can be configured to move at least first portion 1924 in both first direction 2002 and second direction 2010. An angle 1944 can be formed between wire 1942 and direction 1936 in which reticle stage 1912 is configured to move. Angle 1944 can be different from zero degrees. Over the course of a scan, having angle 1944 different from zero degrees prevents a given point in reticle 1938 from being continuously blocked from light 1914 by wire 1942.

FIGS. 27, 28, and 29 illustrate configurations of apparatus 1900 with alternative actuators. Conceptually, actuation may also be realized by an electromagnetic actuator, an electrostatic actuator, a photonic actuator, or the like. FIG. 27 illustrates a configuration of apparatus 1900 in which first actuator 1904 is an electromagnetic actuator 2700. Electromagnetic actuator 2700 may have a first magnetic part 2702 coupled to first portion 1924 of blade structure 1902 and a second magnetic part 2704 coupled to frame 1926. First magnetic part 2702 may be coupled via a magnetic field 2706 to second magnetic part 2704. First magnetic part 2702 may be a permanent magnet and second magnetic part 2704 may be an electromagnet, or vice versa. FIG. 28 illustrates a configuration of apparatus 1900 in which first actuator 1904 is an electrostatic actuator 2800. Electrostatic actuator 2800 may have a first electrode 2802 coupled to first portion 1924 and a second electrode 2804 coupled to frame 1926. First electrode 2802 may be coupled via an electrostatic field 2706 to second electrode 2804. FIG. 29 illustrates a configuration of apparatus 1900 in which first actuator 1904 is a photonic actuator 2900. Photonic actuator 2900 may have a first photonic part 2902 coupled to first portion 1924 and a second photonic 2904 part coupled to frame 1926. First photonic part 2902 may be coupled via a photonic energy 2906 to second photonic part 2904. First photonic part 2902 may be a photon source and second photonic part 2904 may be a reaction frame, or vice versa. The skilled artisan may recognize other means by which actuation can be realized. Therefore, the present invention is not limited to the actuation means described above.

As depicted at FIGS. 19 and 20, when illumination system 1910 provides light 1914 having illumination field 1916, a movement of at least first portion 1924 of blade structure 1902 of apparatus 1900 in first direction 2002 decreases the aggregate intensity of light 1914 within illumination field 1916. This is because second area 2006 is larger than first area 1922 so that a greater portion of light 1914 within illumination field 1916 impinges upon blade structure 1902. However, apparatus 1900 can alternatively be configured so that a movement of at least first portion 1924 of blade structure 1902 increases the aggregate intensity of light 1914 within illumination field 1916. For example, apparatus 1900 can be configured so that FIG. 20 shows apparatus 1900 before blade structure 1902 has been moved by first actuator 1904, while FIG. 19 shows apparatus 1900 after blade structure 1902 has been moved by first actuator 1904. Here, first direction 2002 is reversed so that a movement of at least first portion 1924 of blade structure 1902 of apparatus 1900 in first direction 2002 increases the aggregate intensity of light 1914 within illumination field 1916.

Figure 30:
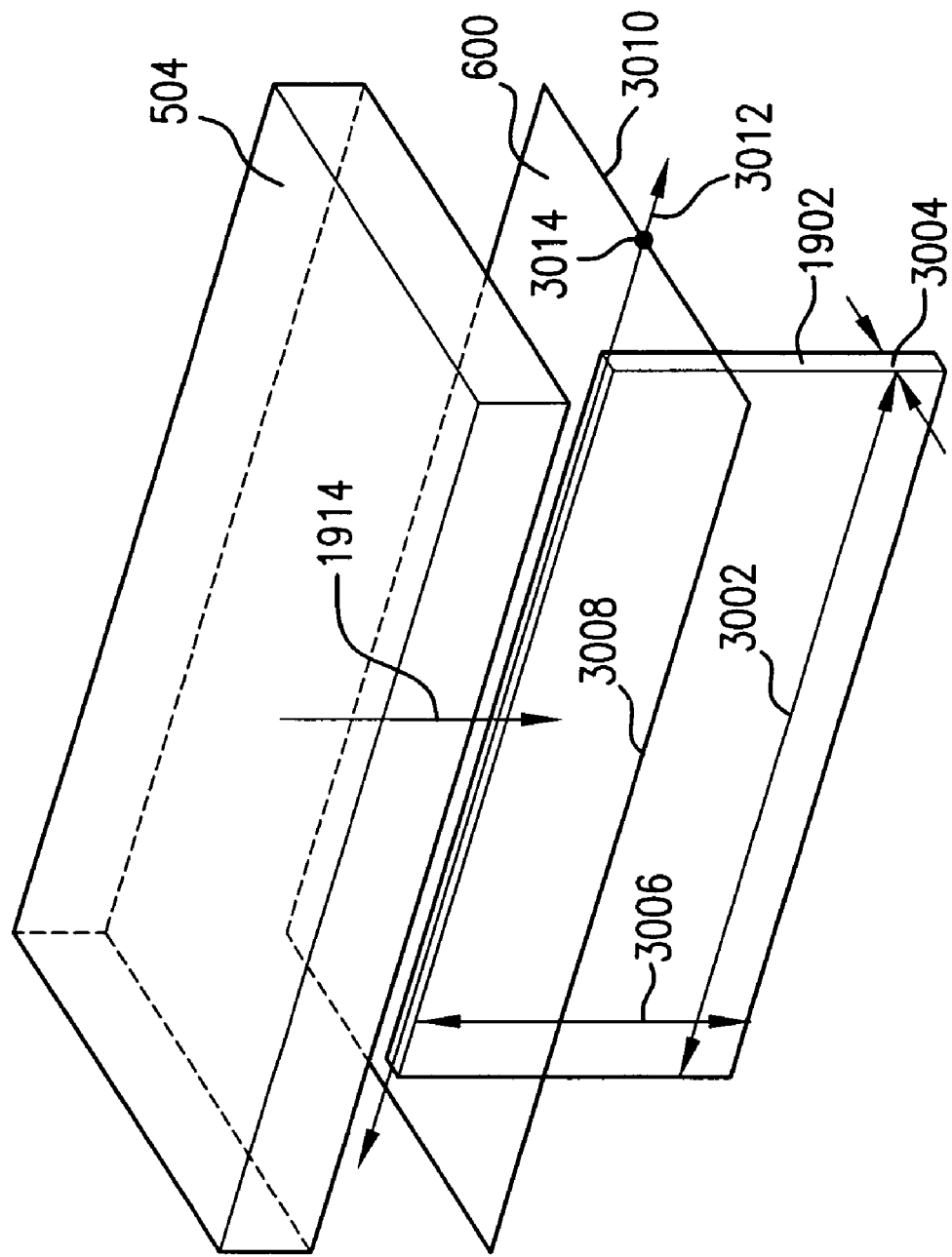
FIG. 30 illustrates blade structure 1902 configured for use in DUV photolithography system 500.

In an embodiment, photolithograpy system 1908 can be DUV photolithography system 500. FIG. 30 illustrates blade structure 1902 configured for use in DUV photolithography system 500. Here, illumination field 1916 can be illumination field 600, which is shaped as a rectangle. Blade structure 1902 can have a blade structure length 3002, a blade structure width 3004, and a blade structure height 3006. Blade structure 1902 can be oriented so that, when DUV illumination system 504 provides light 1914 having illumination field 600, blade structure length 3002 is substantially parallel to an illumination field length 3008, blade structure width 3004 is substantially parallel to an illumination field width 3010, and blade structure width 3004 substantially intersects a line 3012, substantially parallel to illumination field length 3008, that passes through a midpoint 3014 of illumination field width 3010. Blade structure width 3004 can be, but is not limited to, about ten microns.

Figure 31:
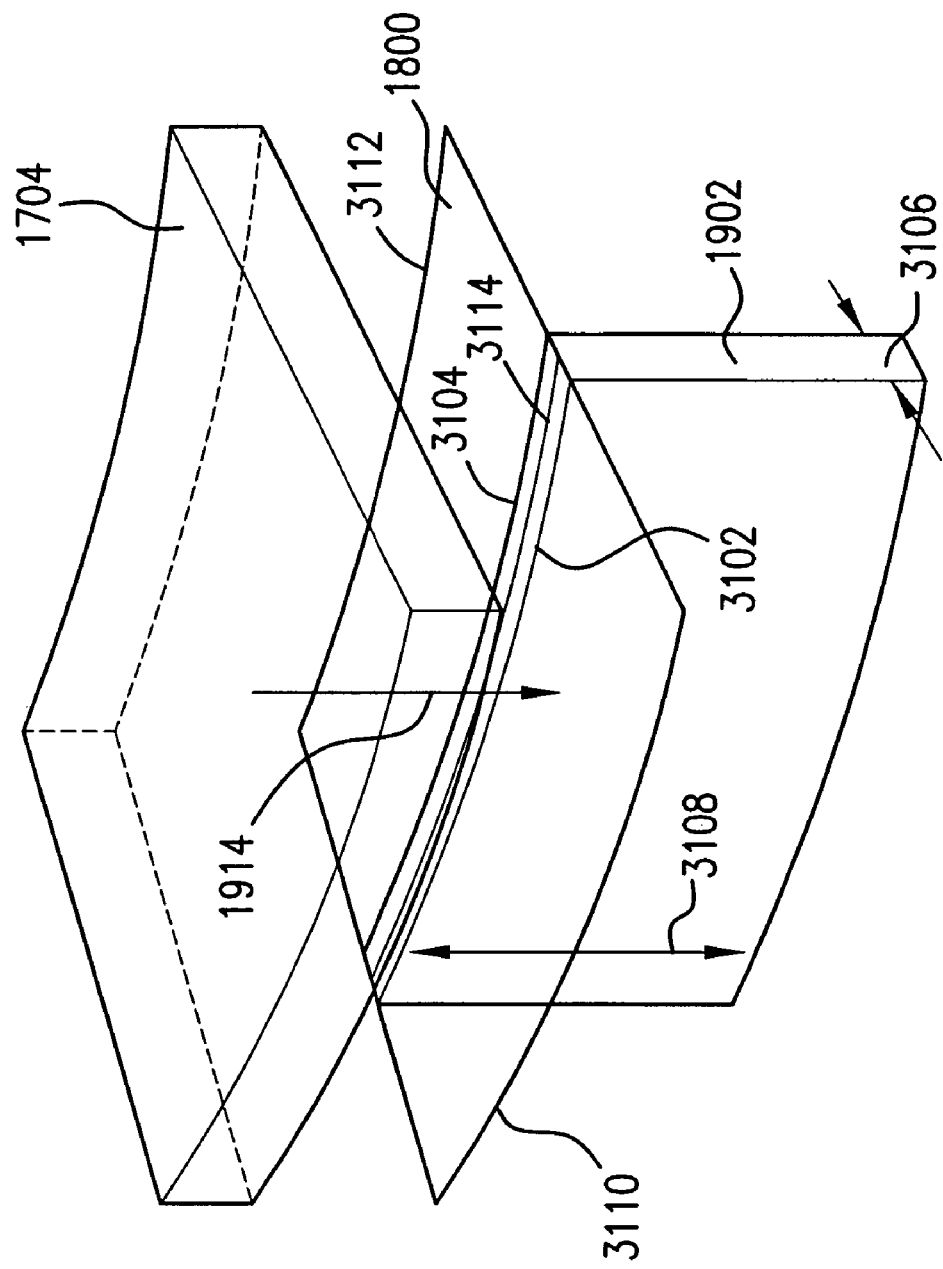
FIG. 31 illustrates blade structure 1902 configured for use in EUV photolithography system 1700.

In another embodiment, photolithograpy system 1908 can be EUV photolithography system 1700. FIG. 31 illustrates blade structure 1902 configured for use in EUV photolithography system 1700. Here, illumination field 1916 can be illumination field 1800, which is shaped as an annulus sector. Blade structure 1902 can have a blade structure outer arc 3102, a blade structure inner arc 3104, a blade structure width 3106, and a blade structure height 3108. Blade structure 1902 can be oriented so that, when EUV illumination system 1704 provides light 1914 having illumination field 1800, blade structure outer arc 3102 is substantially similar to an illumination field outer arc 3110, blade structure inner arc 3104 is substantially similar to an illumination field inner arc 3112, and blade structure width 3106 substantially intersects an arc 3114 located midway between illumination field outer arc 3110 and illumination field inner arc 3112. Blade structure width 3106 can be, but is not limited to, about ten microns.

Figure 32:
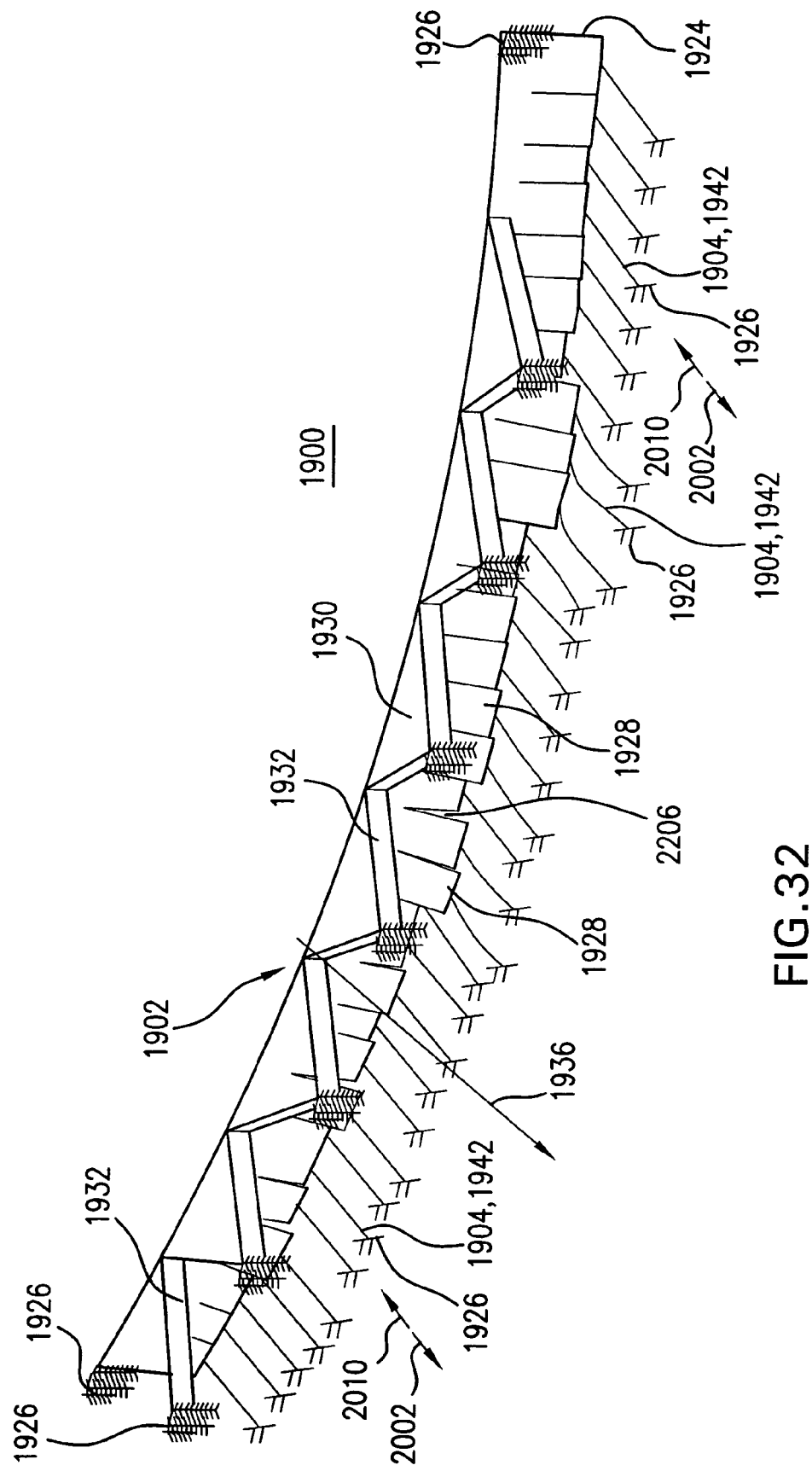
FIG. 32 illustrates a specific embodiment of apparatus 1900.

FIG. 32 illustrates a specific embodiment of apparatus 1900. Here, first portion 1924 of blade structure 1902 comprises thirty-three flaps 1928. Blade structure width 3106 is about ten microns. Each flap 1928 is coupled to second portion 1930 of blade structure 1902. Each flap 1928 has a height of about eight millimeters and second portion 1930 has a height of about two millimeters so that the blade structure height is about ten millimeters. Each flap 1928 is separated from an adjacent flap 1928 by slit 2206. The closed end of slit 2206 can have a shape to reduce stress at the closed end. For example, the shape can be a keyhole shape. Seven struts 1932 are coupled between second portion 1930 and frame 1926. Each strut 1932 has a height of about two millimeters and a width of about ten microns. Each strut 1932 has a V-shape so that an angle is formed between strut 1932 and direction 1936 in which a reticle stage (not shown) of the photolithography system is configured to move.

First actuator 1904 comprises thirty-three mechanical actuators. Each mechanical actuator has wire 1942 coupled between a corresponding flap 1928 and frame 1926 and configured to move the corresponding flap in first direction 2002. Wire 1942 is about ten microns thick. Control of each mechanical actuator is independent of control of the other mechanical actuators. Each flap 1928 can be configured to move in second direction 2010 via a gravitational force, an elastic restoring force, or both. Each flap 1928 can have a part (not shown) with sufficient mass to provide the gravitational force. For example, each part can be fashioned as a sphere (not shown) of wire 1942 formed where wire 1942 is coupled to flap 1928.

Blade structure 1902 can be made from any of a variety of materials. Selection of a material should consider at least its stability in a photolithographic environment (particularly if blade structure 1902 will be used in an EUV photolithography system), thermal conductivity, electrical conductivity, and elasticity. Depending upon these parameters, blade structure 1902 can be made from any of the following materials, alone or in combination: stainless steel, silver, nickel, aluminum, copper, and silicon. However, blade structure 1902 can also be made from other materials as recognized by the skilled artisan.

Blade structure 1902 can be made by several different methods. For example, blade structure 1902 can be cut to form from stock material by wire electric discharge machining. In another example, a pattern of blade structure 1902 can be made from a first material (e.g., aluminum), which is electroplated with a second material (e.g., nickel), followed by removal of the first material by etching to release blade structure 1902. The pattern can be made by milling or wire electric discharge machining. In yet another example, the various portions of blade structure 1902 (e.g., first portion 1924, flaps 1928, second portion 1930, etc.) can be made individually and then assembled by electron beam welding. The skilled artisan recognizes other methods by which blade structure 1902 can be made.

Once blade structure 1902 has been made, a hole can be formed in first portion 1924 by electric discharge machining or a similar process. Wire 1942 can be passed through the hole for use in first actuator 1904. Wire 1942 can be coupled to first portion 1924 by forming a sphere of wire 1942 large enough not to pass through the hole. The sphere can also provide first portion 1924 with mass to provide a sufficient gravitational force to move first portion 1924. The skilled artisan recognizes other methods by which first actuator 1904 can be made.

Figure 33:
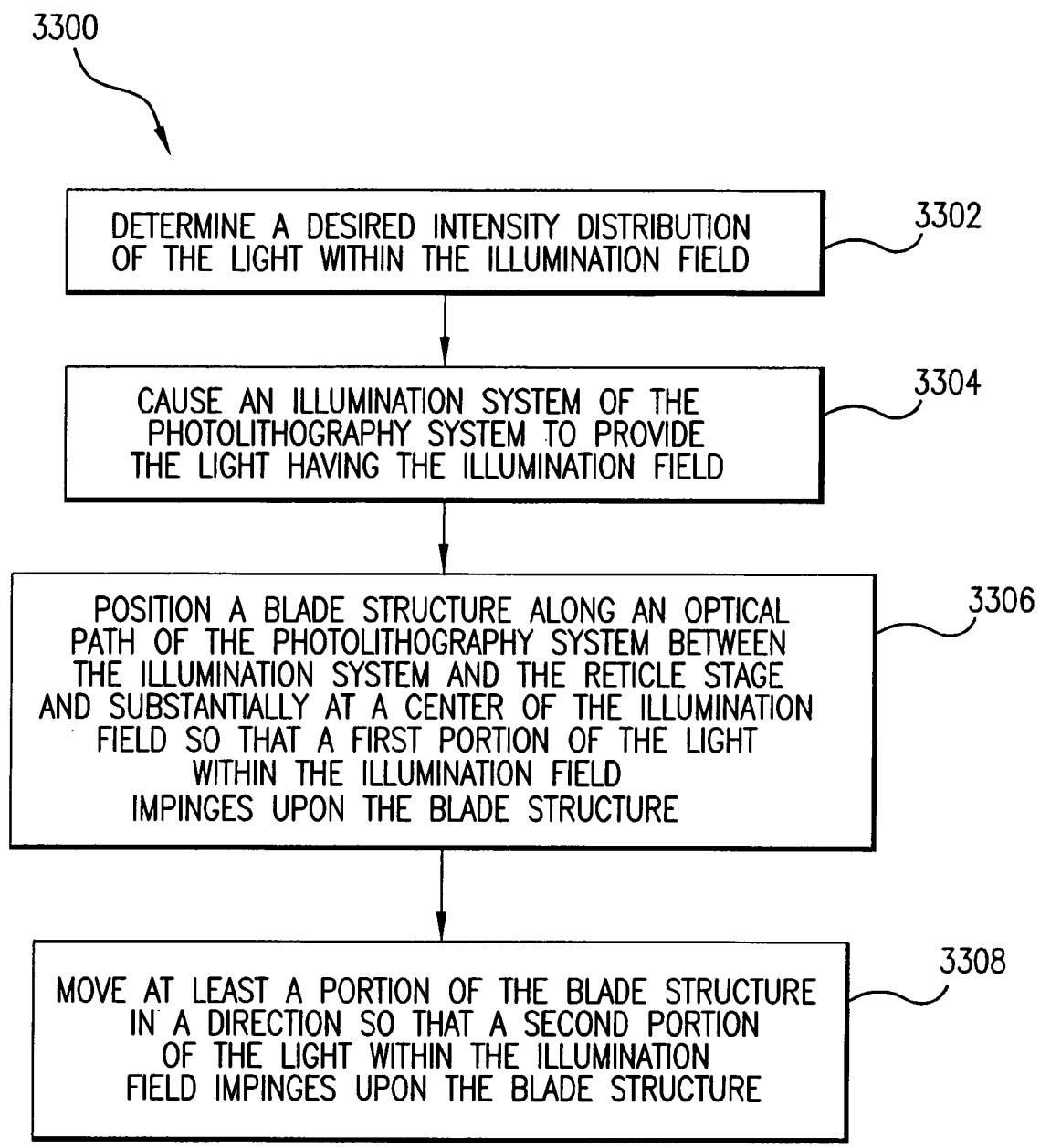
FIG. 33 is a flow chart that illustrates a method 3300 for changing an aggregate intensity of a light within an illumination field of a photolithography system.

FIG. 33 is a flow chart that illustrates a method 3300 for changing an aggregate intensity of a light within an illumination field of a photolithography system. In method 3300, optionally, at a step 3302, a desired intensity distribution of the light within the illumination field is determined. Although the present invention has been described in terms of providing a uniform intensity distribution, the skilled artisan recognizes that the present invention can be used to provide other intensity distributions as may be desired. Therefore, the present invention is not limited to use in providing a uniform intensity distribution.

The desired intensity distribution of the light within the illumination field can be realized at any of a variety of locations along the optical path. The desired intensity distribution of the light within the illumination field can be, but is not necessarily, located at a reticle supported by a reticle stage of the photolithography system. For example, the desired intensity distribution of light 1914 within illumination field 1916 can be located at reticle 1938 supported by reticle stage 1912 of photolithography system 1908.

At a step 3304, an illumination system of the photolithography system is caused to provide the light having the illumination field. For example, illumination system 1910 of photolithography system 1908 can be caused to provide light 1914 having illumination field 1916.

At a step 3306, a blade structure is positioned along an optical path of the photolithography system between the illumination system and the reticle stage and substantially at a center of the illumination field so that a first portion of the light within the illumination field impinges upon the blade structure. The blade structure is either translucent to a wavelength of the light or opaque to the wavelength. The first portion of the light has a first area. For example, blade structure 1902 can be positioned along optical path 1906 of photolithography system 1908 between illumination system 1910 and reticle stage 1912 of photolithography system 1908 and substantially at center 1918 of illumination field 1916 so that first portion 1920 of light 1914 within illumination field 1916 impinges upon blade structure 1902. Blade structure 1902 can be either translucent or opaque to a wavelength of light 1914. First portion 1920 of light 1914 can have first area 1922.

At a step 3308, at least a portion of the blade structure is moved in a direction so that a second portion of the light within the illumination field impinges upon the blade structure. The second portion of the light has a second area, which is different from the first area. For example, at least first portion 1924 of blade structure 1902 can be moved in first direction 2002 so that second portion 2004 of light 1914 within illumination field 1916 impinges upon blade structure 1902. Second portion 2004 of light 1914 can have second area 2006, which is different from first area 1922.

In an embodiment, step 3308 can decrease the aggregate intensity of the light within the illumination field. For example, when apparatus 1900 before blade structure 1902 has been moved is configured as shown at FIG. 19, and apparatus 1900 after blade structure 1902 has been moved is configured as shown at FIG. 20, movement of at least a portion of blade structure 1902 in first direction 2002 decreases the aggregate intensity of light 1914 within illumination field 1916. Alternatively, step 3308 can increase the aggregate intensity of the light within the illumination field. For example, when apparatus 1900 before blade structure 1902 has been moved is configured as shown at FIG. 20, and apparatus 1900 after blade structure 1902 has been moved is configured as shown at FIG. 19, movement of at least a portion of blade structure 1902 in second direction 2010 increases the aggregate intensity of light 1914 within illumination field 1916.

In another embodiment, the portion of the blade structure can comprise a plurality of portions. For example, flap 1928 can comprise a plurality of flaps. A first portion of the plurality of portions can move in the direction, while a position of a second portion of the plurality of portions can be maintained. For example, first flap 2202 can move in first direction 2002, while second flap 2204 can be maintained at its position. Alternatively, the first portion of the plurality of portions can move in the direction by the first distance, while the second portion of the plurality of portions can move in the direction by a second distance. For example, first flap 2202 can move in first direction 2002 by first distance 2402, while second actuator 2214 can move second flap 2204 in first direction 2002 by second distance 2404. The second distance is different from the first distance so that movement of the first portion of the plurality of portions causes a third portion of the light within the illumination field to impinge upon the blade structure and movement of the second portion of the plurality of portions causes a fourth portion of the light within the illumination field to impinge upon the blade structure. The third portion of the light has a third area and the fourth portion of the light has a fourth area. The second area is equal to a sum of the third area and the fourth area.

In yet another embodiment, a telecentricity of the light that impinges upon a layer of photoresist applied to a wafer supported by a wafer stage of the photolithography system after step 3308 can be substantially the same as the telecentricity of the light that impinges upon the layer of photoresist before step 3308. For example, when pupil fills across intensity distribution 700 after step 3308 are configured as shown at FIG. 21, and pupil fills across intensity distribution 700 before step 3308 are configured as shown at FIG. 14, the telecentricity of the light that impinges upon the layer of photoresist after step 3308 is substantially the same as the telecentricity of the light that impinges upon the layer of photoresist before step 3308.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. An apparatus for changing an intensity distribution of a light within an illumination field, comprising:
 a structure configured to be positioned within the illumination field so that a first portion of the light within the illumination field impinges upon the structure, the first portion of the light having a first area defined by a first value, wherein the structure is one of translucent to a wavelength of the light and opaque to the wavelength; and
 an actuator configured to cause a movement of a first portion of the structure so that a second portion of the light within the illumination field impinges upon the structure, the first portion of the structure being a flap coupled to a second portion of the structure, the second portion of the light having a second area defined by a second value, the second value different from the first value;
 wherein the light within the illumination field is produced by a source configured so that a pupil fill of a beam of the light is uncontrolled, but the beam of the light downstream of the structure is substantially telecentric before and after the movement of the first portion of the structure.

2. The apparatus of claim 1, wherein the flap is coupled to the second portion of the structure by a hinge.

3. The apparatus of claim 1, wherein the flap comprises a plurality of flaps such that a first flap of the plurality of flaps is separated from a second flap of the plurality of flaps by a slit.

4. The apparatus of claim 3, wherein a closed end of the slit has a keyhole shape.

5. An apparatus for changing an intensity distribution of a light within an illumination field, comprising:
 a structure configured to be positioned within the illumination field so that a first portion of the light within the illumination field impinges upon the structure, the first portion of the light having a first area defined by a first value, wherein the structure is one of translucent to a wavelength of the light and opaque to the wavelength; and
 a first actuator configured to cause a movement of a portion of the structure in a first direction so that a second portion of the light within the illumination field impinges upon the structure, the second portion of the light having a second area defined by a second value, wherein a difference of the second value subtracted from the first value is equal to any value within a continuous range;
 wherein the light within the illumination field is produced by a source configured so that a pupil fill of a beam of the light is uncontrolled, but the beam of the light downstream of the structure is substantially telecentric before and after the movement of the first portion of the structure.

6. The apparatus of claim 5, wherein the movement is a rotation.

7. The apparatus of claim 5, wherein the first actuator is further configured to cause the movement of the portion of the structure in a second direction, the second direction different from the first direction.

8. The apparatus of claim 5, wherein the portion of the structure is configured to move in a second direction via a gravitational force, the second direction different from the first direction.

9. The apparatus of claim 8, wherein the portion of the structure has a part with sufficient mass to provide the gravitational force.

10. The apparatus of claim 5, wherein the structure is made of at least an elastic material and is configured to move in a second direction via an elastic restoring force, the second direction different from the first direction.

11. The apparatus of claim 5, further comprising a second actuator configured to cause the movement of the portion of the structure in a second direction, the second direction different from the first direction.

12. An apparatus for changing an intensity distribution of a light within an illumination field, comprising:
 a structure configured to be positioned within the illumination field so that a first portion of the light within the illumination field impinges upon the structure, the first portion of the light having a first area defined by a first value, wherein the structure is one of translucent to a wavelength of the light and opaque to the wavelength, wherein a length of the structure is substantially parallel to a length of the illumination field; and an actuator configured to cause a movement of a portion of the structure so that a second portion of the light within the illumination field impinges upon the structure, the second portion of the light having a second area defined by a second value, the second value different from the first value;

wherein the light within the illumination field is produced by a source configured so that a pupil fill of a beam of the light is uncontrolled, but the beam of the light downstream of the structure is substantially telecentric before and after the movement of the portion of the structure.

13. An apparatus for changing an intensity distribution of a light within an illumination field, comprising:

a structure configured to be positioned within the illumination field so that a first portion of the light within the illumination field impinges upon the structure, the first portion of the light having a first area defined by a first value, wherein the structure is one of translucent to a wavelength of the light and opaque to the wavelength, wherein an arc of the structure is substantially similar to an arc of the illumination field; and an actuator configured to cause a movement of a portion of the structure so that a second portion of the light within the illumination field impinges upon the structure, the second portion of the light having a second area defined by a second value, the second value different from the first value;

wherein the light within the illumination field is produced by a source configured so that a pupil fill of a beam of the light is uncontrolled, but the beam of the light downstream of the structure is substantially telecentric before and after the movement of the portion of the structure.

14. A method for changing an intensity distribution of a light within an illumination field, comprising the steps of:

(1) producing a beam of the light so that a pupil fill of the beam of the light is uncontrolled;

(2) positioning a structure within the illumination field so that a first portion of the light within the illumination field impinges upon the structure, the first portion of the light having a first area defined by a first value, wherein the structure is one of translucent to a wavelength of the light and opaque to the wavelength; and (3) causing a movement of a portion of the structure so that a second portion of the light within the illumination field impinges upon the structure, the second portion of the light having a second area defined by a second value, wherein a difference of the second value subtracted from the first value is equal to any value within a continuous range, and the beam of the light downstream of the structure is substantially telecentric before and after the movement of the portion of the structure.

15. The method of claim 14, wherein the movement is a rotation.

16. The method of claim 14, wherein the portion of the structure comprises a plurality of portions of the structure and the causing the movement step further comprises:

(a) causing the movement of a first portion of the plurality of portions of the structure in a first direction; and (b) causing the movement of a second portion of the plurality of portions of the structure in a second direction, the second direction different from the first direction.

17. The method of claim 14, wherein the portion of the structure comprises a plurality of portions of the structure and the causing the movement step further comprises:

(a) causing the movement of a first portion of the plurality of portions of the structure in a direction by a first distance; and (b) causing the movement of a second portion of the plurality of portions of the structure in the direction by a second distance, the second distance different from the first distance.

18. A method for changing an intensity distribution of a light within an illumination field, comprising the steps of:

(1) producing a beam of the light so that a pupil fill of the beam of the light is uncontrolled;

(2) positioning a structure within the illumination field so that a first portion of the light within the illumination field impinges upon the structure, wherein the structure is one of translucent to a wavelength of the light and opaque to the wavelength;

(3) causing a first movement of a first portion of the structure so that a second portion of the light within the illumination field impinges upon the structure, wherein the beam of the light downstream of the structure is substantially telecentric before and after the first movement; and (4) causing a second movement of a second portion of the structure so that a third portion of the light within the illumination field impinges upon the structure, wherein the beam of the light downstream of the structure is substantially telecentric before and after the second movement, and the second portion of the structure is different from the first portion of the structure.

19. The method of claim 18, wherein the first movement is in a first direction, the second movement is in a second direction, and the second direction is different from the first direction.

20. The method of claim 18, wherein the first movement is in a direction by a first distance, the second movement is in the direction by a second distance, and the second distance is different from the first distance.

* * * * *